United States Patent
Honda

(10) Patent No.: US 8,259,502 B2
(45) Date of Patent: Sep. 4, 2012

(54) NAND FLASH MEMORY

(75) Inventor: Yasuhiko Honda, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 94 days.

(21) Appl. No.: 12/886,275

(22) Filed: Sep. 20, 2010

(65) Prior Publication Data

US 2011/0128788 A1    Jun. 2, 2011

(30) Foreign Application Priority Data

Nov. 27, 2009  (JP) ................................ 2009-270417

(51) Int. Cl.
*G11C 16/04* (2006.01)
(52) U.S. Cl. .............................. 365/185.17; 365/185.11
(58) Field of Classification Search ............. 365/185.17, 365/185.11, 185.18
See application file for complete search history.

(56) References Cited

U.S. PATENT DOCUMENTS

| 7,518,921 | B2 * | 4/2009 | Maejima et al. | ......... 365/185.17 |
| 2009/0201738 | A1 * | 8/2009 | Sato | .................. 365/185.17 |
| 2009/0273976 | A1 * | 11/2009 | Maejima et al. | ......... 365/185.05 |

FOREIGN PATENT DOCUMENTS

| JP | 11-224492 | 8/1999 |
| JP | 2009-158048 | 7/2009 |

* cited by examiner

*Primary Examiner* — Anh Phung
(74) *Attorney, Agent, or Firm* — Oblon, Spivak, McClelland, Maier & Neustadt, L.L.P.

(57) ABSTRACT

A NAND flash memory having a memory cell array formed of a plurality of blocks including memory cell transistors arranged in a matrix form. The NAND flash memory has a first bit line; a first sense amplifier connected to the first bit line, the first sense amplifier sensing or controlling a potential on the first bit line; a second bit line; and a second sense amplifier connected to the second bit line to sense or control a potential on the second bit line. The NAND flash memory has a first drain side selection gate line; a second drain side selection gate line; a third drain side selection gate line; a fourth drain side selection gate line; a first source side selection gate line; and a second source side selection gate line. The NAND flash memory has a first block; a second block; and a decoder which turns on one of the first and third drain side selection MOS transistors and turns off the other, and which turns on one of the third and fourth drain side selection MOS transistors and turns off the other.

20 Claims, 13 Drawing Sheets

NAND FLASH MEMORY

CROSS-REFERENCE TO RELATED APPLICATION

This application is based upon and claims the benefit of priority from the prior Japanese Patent Application No. 2009-270417, filed on Nov. 27, 2009, the entire contents of which are incorporated herein by reference.

FIELD

The present invention relates to a NAND flash memory.

BACKGROUND

As a conventional art, a NAND flash memory of the ABL (All Bit Line) sense scheme in which sense amplifiers are provided for all bit lines BL and all bit lines BL are sensed at the same time is known (see, for example, JP-A-2009-158048 (KOKAI)). In such a NAND flash memory, a plurality of memory cells connected to one word line (i.e., one page address) in one block in one memory cell array formed in one well are subject to reading and writing at the same time according to the conventional art.

The number of memory cells which can be sensed at the same time, i.e., the storage capacity in one page (page length) is increased by using the ABL scheme as compared with a scheme in which sense amplifiers are provided for alternate bit lines BL and even-numbered bit lines BLe and odd-numbered bit lines BLo are sensed alternately. As a result, it becomes possible to improve the readout speed per unit.

On the other hand, demands for reading and writing of random page addresses have increased in recent years. An excessive increase of the page length is disadvantageous to improvement of the random access performance. Therefore, it is necessary to improve the reading and writing speed of random page addresses while taking tradeoff to the reading speed improvement per unit into consideration.

For example, in some conventional NAND flash memories, one row decoder simultaneously selects word lines of the same address for two memory cell arrays and conducts writing into the two memory cell arrays (see, for example, JP-A-11-224492 (KOKAI)).

In the conventional NAND flash memory, a data latch circuit is provided for each of the two memory cell arrays. In other words, bit lines are not connected in common in these memory cell arrays. Furthermore, in the conventional NAND flash memory, operation for a random page address in one memory cell array is not prescribed.

DETAILED DESCRIPTION

Figure 1:
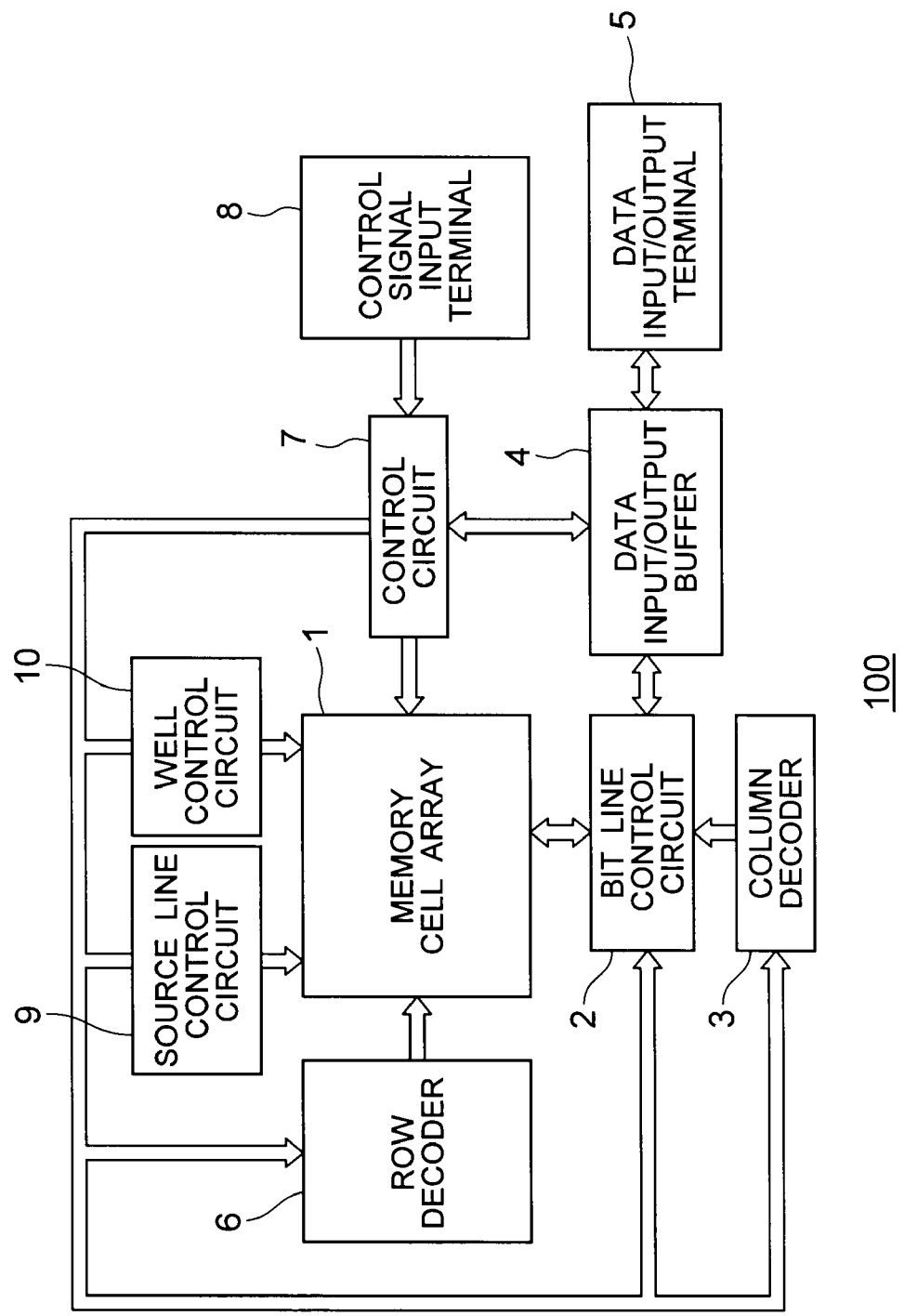
FIG. 1 is a block diagram showing an example of a configuration of a NAND flash memory 100 according to a first embodiment of the present invention.

A NAND flash memory according to the present invention has a memory cell array formed of a plurality of blocks including memory cell transistors arranged in a matrix form. The NAND flash memory has a first bit line; a first sense amplifier connected to the first bit line, the first sense amplifier sensing or controlling a potential on the first bit line; a second bit line; and a second sense amplifier connected to the second bit line to sense or control a potential on the second bit line. The NAND flash memory has a first drain side selection gate line; a second drain side selection gate line; a third drain side selection gate line; a fourth drain side selection gate line; a first source side selection gate line; and a second source side selection gate line. The NAND flash memory has a first block; and a second block. The first block has a first drain side selection MOS transistor connected at a gate thereof to the first drain side selection gate line and connected at a drain diffusion layer thereof to the first bit line, a first source side selection MOS transistor connected at a gate thereof to the first source side selection gate line, a plurality of first memory cell transistors connected in series between the source diffusion layer of the first drain side selection MOS transistor and the drain diffusion layer of the first source side selection MOS transistor, a second drain side selection MOS transistor connected at a gate thereof to the second drain side selection gate line and connected at a drain diffusion layer thereof to the second bit line, a second source side selection MOS transistor connected at a gate thereof to the first source side selection gate line, and a plurality of second memory cell transistors connected in series between the source diffusion layer of the second drain side selection MOS transistor and the drain diffusion layer of the second source side selection MOS transistor. The second block has the third drain side selection MOS transistor connected at a gate thereof to the third drain side selection gate line and connected at a drain diffusion layer thereof to the first bit line, a third source side selection MOS transistor connected at a gate thereof to the second source side selection gate line, a plurality of third memory cell transistors connected in series between the source diffusion layer of the third drain side selection MOS transistor and the drain diffusion layer of the third source side selection MOS transistor, a fourth drain side selection MOS transistor connected at a gate thereof to the fourth drain side selection gate line and connected at a drain diffusion layer thereof to the second bit line, a fourth source side selection MOS transistor connected at a gate thereof to the second source side selection gate line, and a plurality of fourth memory cell transistors connected in series between the source diffusion layer of the fourth drain side selection MOS transistor and the drain diffusion layer of the fourth source side selection MOS transistor. The NAND flash memory has a decoder which turns on one of the first and third drain side selection MOS transistors and turns off the other, and which turns on one of the third and fourth drain side selection MOS transistors and turns off the other.

Embodiments will now be explained with reference to the accompanying drawings.

(First Embodiment)

Figure 2:
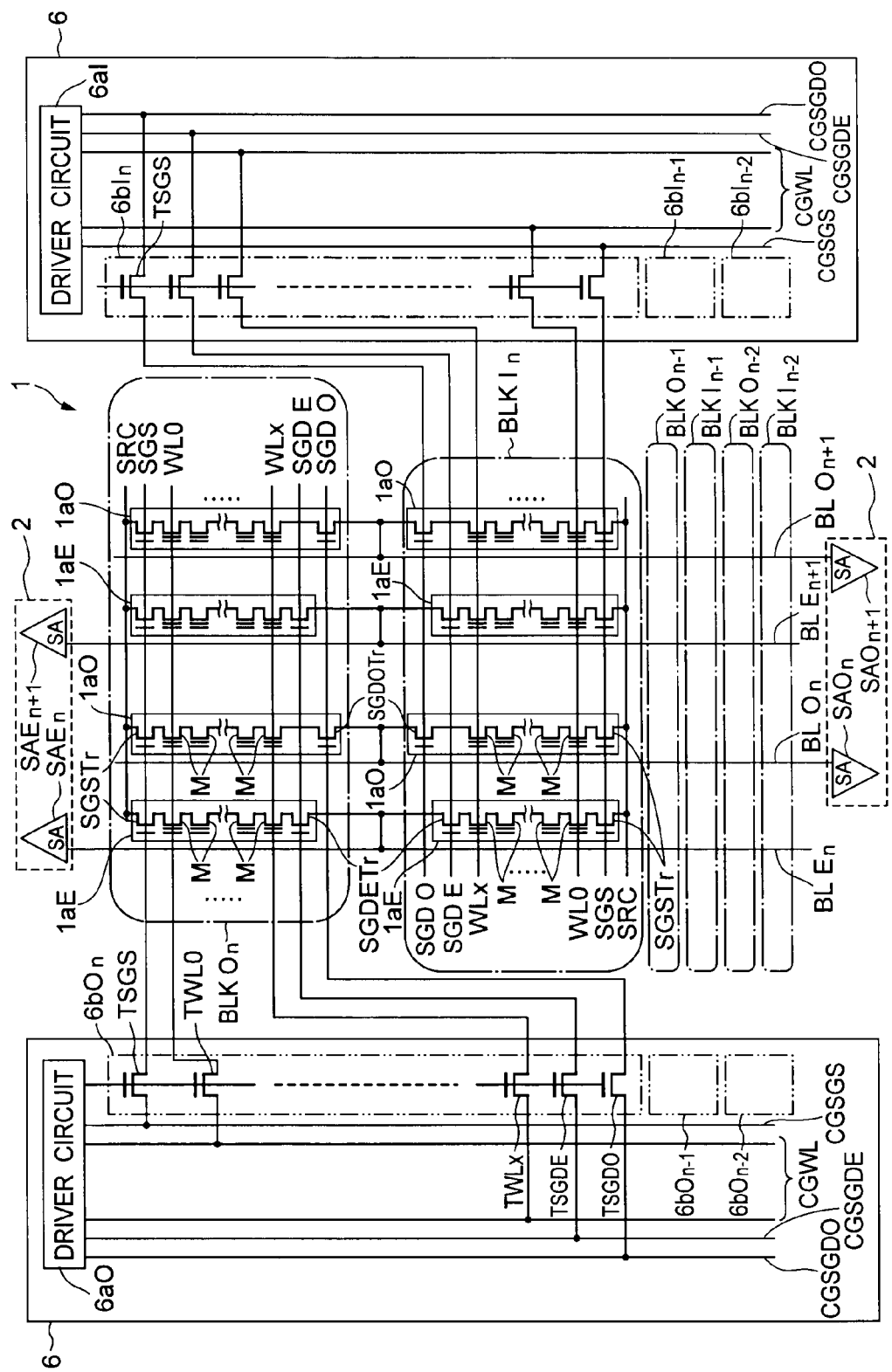
FIG. 2 is a circuit diagram showing an example of a configuration according to the first embodiment including a memory cell array 1, a bit line control circuit 2 and a row decoder 6.

FIG. 1 is a block diagram showing an example of a configuration of a NAND flash memory 100 according to a first embodiment of the present invention. FIG. 2 is a circuit diagram showing an example of a configuration according to the first embodiment including a memory cell array 1, a bit line control circuit 2 and a row decoder 6.

As shown in FIG. 1, the NAND flash memory 100 includes a memory cell array 1, a bit line control circuit 2, a column decoder 3, a data input/output buffer 4, a data input/output terminal 5, a row decoder 6, a control circuit 7, a control signal input terminal 8, a source line control circuit 9, and a well control circuit 10.

The memory cell array 1 includes a plurality of bit lines, a plurality of word lines, and source lines. The memory cell array 1 includes a plurality of blocks (FIG. 2) each including EEPROM cells and electrically data rewritable memory cell transistors arranged in a matrix form.

The bit line control circuit 2 for controlling a voltage on a bit line and the row decoder 6 for controlling a voltage on a word line are connected to the memory cell array 1. At the time of data erasing operation, some block is selected by the row decoder 6 and remaining blocks are made unselected.

The bit line control circuit 2 includes a sense amplifier SA (FIG. 2) for sensing and amplifying a voltage on a bit line in the memory cell array 1 and a data storage circuit (not illustrated) which has roles of a circuit for conducting writing and a data latch circuit for latching the circuit for conducting writing.

The bit line control circuit 2 reads out data in a memory cell transistor in the memory cell array 1 via a bit line, detects a state in the memory cell transistor via a bit line, and applies a write control voltage to the memory cell transistor via a bit line to write data into the memory cell transistor.

Furthermore, the column decoder 3 and the data input/output buffer 4 are connected to the bit line control circuit 2. The data storage circuit in the bit line control circuit 2 is selected by the column decoder 3, and data in the memory cell transistor read out in the data storage circuit is output from the data input/output terminal 5 to the outside via the data input/output buffer 4.

Furthermore, write data which is input from the outside to the data input/output terminal 5 is stored in the data storage circuit selected by the column decoder 3. From the data input/output terminal 5, various commands such as writing, reading, erasing and status reading and an address are also input besides write data.

The row decoder 6 is connected to the memory cell array 1. The row decoder 6 applies a voltage required for reading, writing or erasing to a word line of the memory cell array 1.

The source line control circuit 9 is connected to the memory cell array 1. The source line control circuit 9 is adapted to control a voltage on a source line.

The well control circuit 10 is connected to the memory cell array 1. The well control circuit 10 is adapted to control a voltage on a semiconductor substrate (well) on which memory cell transistors are formed.

The control circuit 7 is adapted to control the memory cell array 1, the bit line control circuit 2, the column decoder 3, the data input/output buffer 4, the row decoder 6, the source line control circuit 9 and the well control circuit 10.

It is supposed that a boosting circuit (not illustrated) which boosts the power supply voltage is included in the control circuit 7. The control circuit 7 boosts the power supply voltage by using the boosting circuit as occasion demands, and supplies the boosted voltage to the bit line control circuit 2, the column decoder 3, the data input/output buffer 4, the row decoder 6, the source line control circuit 9 and the well control circuit 10.

The control circuit 7 conducts control operation on the basis of a control signal (such as a command latch enable signal CLE, an address latch enable signal ALE, or a ready/busy signal RY/BY) which is input from the outside via the control signal input terminal 8 and a command which is given from the data input/output terminal 5 via the data input/output buffer 4. In other words, the control circuit 7 generates desired voltages at the time of data programming, verifying, reading and erasing according to the control signal and the command, and supplies the voltages to respective units in the memory cell array 1.

As shown in FIG. 2, the memory cell array 1 includes blocks BLKOn, BLKIn, BLKOn−1, BLKIn−1, BLKOn−2 and BLKIn−2 each configured by connecting a plurality of NAND cell units 1aE in even-numbered columns and a plurality of NAND cell units 1aO in odd-numbered columns.

Each of the NAND cell units 1aE in even-numbered columns includes x (for example, 64) memory cell transistors M connected in series, a drain side selection MOS transistor SGDETr, and a source side selection MOS transistor SGSTr. The drain side selection MOS transistors SGDETr in even-numbered columns are connected to bit lines BLEn and BLEn+1 in even-numbered columns, respectively. Furthermore, source side selection MOS transistors SGSTr are connected to a source line SRC.

In the same way, each of the NAND cell units 1aE in odd-numbered columns includes x memory cell transistors M connected in series, a drain side selection MOS transistor SGDOTr, and a source side selection MOS transistor SGSTr. The drain side selection MOS transistors SGDOTr in odd-numbered columns are connected to bit lines BLOn and BLOn+1 in odd-numbered columns, respectively. Furthermore, source side selection MOS transistors SGSTr are connected to a source line SRC.

Control gates of the memory cell transistors M arranged in rows are connected to word lines WL0 to WLx, respectively.

The bit lines BLEn, BLEn+1, BLOn and BLOn+1 are arranged perpendicularly to the word lines WL0 to WLx and the common source lines SRC.

In FIG. 2, only the word lines WL0 and WLx are shown for brevity, and word lines arranged between them are omitted.

Gates of the drain side selection MOS transistors SGDETr are connected to a drain side selection gate line SGDE. Gates of the drain side selection MOS transistors SGDOTr are connected to a drain side selection gate line SGDO. Gates of the source side selection MOS transistors SGSTr are connected to a source side selection gate line SGS.

Sense amplifiers SAEn, SAOn, SAEn+1 and SAOn+1 in the bit line control circuit 2 are connected to bit lines BLEn, BLOn, BLEn+1 and BLOn+1, respectively. In addition, the sense amplifiers SAEn, SAOn, SAEn+1 and SAOn+1 are adapted to sense or control potentials on the connected bit lines BLEn, BLOn, BLEn+1 and BLOn+1, respectively.

As shown in FIG. 2, the row decoder 6 includes driver circuits 6aO and 6aI, a plurality of (block) decoders 6bOn, 6bOn−1, 6bOn−2, 6bIn, 6bIn−1 and 6bIn−2, and control lines CGSGS, CGSGDE, CGSGDO and CGWL. The decoders 6bOn, 6bOn−1, 6bOn−2, 6bIn, 6bIn−1 and 6bIn−2 are arranged, for example, on the left and right of the memory cell array 1 (outer side and inner side) at a 2-block pitch to be opposed to each other with the memory cell array 1 between in the word line WL direction.

In other words, a decoder 6bOn for selecting an even-numbered block BLKOn is disposed in a space located on the left side of the even-numbered block BLKOn and an odd-numbered block BLKIn. A decoder 6bIn for selecting an odd-numbered block BLKIn is disposed in a space located on the right side of the even-numbered block BLKOn and the odd-numbered block BLKIn.

In the same way, a decoder 6bOn−1 for selecting an even-numbered block BLKOn−1 is disposed in a space located on the left side of the even-numbered block BLKOn−1 and an odd-numbered block BLKIn−1. A decoder 6bIn−1 for selecting an odd-numbered block BLKIn−1 is disposed in a space located on the right side of the even-numbered block BLKOn−1 and the odd-numbered block BLKIn−1.

In the same way, a decoder 6bOn−2 for selecting an even-numbered block BLKOn−2 is disposed in a space located on the left side of the even-numbered block BLKOn−2 and an odd-numbered block BLKIn−2. A decoder 6bIn−2 for selecting an odd-numbered block BLKIn−2 is disposed in a space located on the right side of the even-numbered block BLKOn−2 and the odd-numbered block BLKIn−2.

The decoders 6bOn to 6bOn−2 and 6bIn to 6bIn−2 correspond to the blocks BLKOn, BLKIn, BLKOn−1, BLKIn−1, BLKOn−2 and BLKIn−2, respectively. And each of the decoders 6bOn to 6bOn−2 and 6bIn to 6bIn−2 includes a plurality of transfer MOS transistors TSGS, TSGDE, TSGDO and TWL0 to TWLx, which are nMOS transistors.

In FIG. 2, in the decoders 6bOn and 6bIn, only the transfer MOS transistors TWL0 and TWLx are shown as transistors connected to the word lines for brevity, and transfer MOS transistors arranged between them are omitted.

Drains of the transfer MOS transistors TSGS, TSGDE and TSGDO are connected to the source side selection gate line SGS, and the drain side selection gate lines SGDE and SGDO, respectively. Drains of the transfer MOS transistors TWL0 to TWLx are connected respectively to the word lines WL0 to WLx, which are connected to control gates of the memory cell transistors M.

Sources of the transfer MOS transistors TSGS, TSGDE, TSGDO, and TWL0 to TWLx are connected respectively to the control lines CGSGS, CGSGDE, CGSGDO and CGWL, which are connected to the driver circuits 6aO and 6aI.

In other words, the control lines CGSGS, CGSGDE, CGSGDO and CGWL are arranged to be common to the decoders 6bOn, 6bOn−1 and 6bOn−2. In addition, the control lines CGSGS, CGSGDE, CGSGDO and CGWL are arranged to be common to the decoders 6bIn, 6bIn−1 and 6bIn−2.

Furthermore, the driver circuits 6aO and 6aI are adapted to control gate voltage and source voltages of the transfer MOS transistors TSGS, TSGDE, TSGDO, and TWL0 to TWLX according to the output of the control circuit 7. For example, a block selection signal is input to the gates of the transfer MOS transistors TSGS, TSGDE, TSGDO, and TWL0 to TWLx in accordance with an address which is input to the driver circuits 6aO and 6aI from an internal address line which is not illustrated.

In other words, the row decoder 6 controls the transfer MOS transistors TSGS, TSGDE, TSGDO, and TWL0 to TWLx in the decoders 6bOn to 6bOn−2 by controlling the gate voltage and the source voltages in the driver circuit 6aO. As a result, the row decoder 6 selects one of the blocks BLKOn, BLKOn−1 and BLKOn−2 in the memory cell array 1, and controls write operation and read operation of the selected block.

Furthermore, the row decoder 6 controls the transfer MOS transistors TSGS, TSGDE, TSGDO, and TWL0 to TWLX in the decoders 6bIn to 6bIn−2 by controlling the gate voltage and the source voltages in the driver circuit 6aI. As a result, the row decoder 6 selects one of the blocks BLKIn, BLKIn−1 and BLKIn−2 in the memory cell array 1, and controls write operation and read operation of the selected block.

In this way, (block) decoders 6bOn to 6bOn−2 arranged at a 2-block pitch on the left side (outer side) of the memory cell array 1 control the operation of the blocks BLKOn, BLKOn−1 and BLKOn−2 on the basis of the control signals of a first system which are output from the driver circuit 6aO. By the way, a first internal address line, which is not illustrated, is connected to the driver circuit 6aO to select one of the blocks BLKOn, BLKOn−1 and BLKOn−2. The driver circuit 6aO selects one of the blocks BLKOn, BLKOn−1 and BLKOn−2 in accordance with an address which is input from the first internal address line.

Furthermore, (block) decoders 6bIn to 6bIn−2 arranged at a 2-block pitch on the right side (inner side) of the memory cell array 1 control the operation of the blocks BLKIn, BLKIn−1 and BLKIn−2 on the basis of the control signals of a second system which are different from the control signals of the first system. By the way, a second internal address line, which is different from the first internal address line and which is not illustrated, is connected to the driver circuit 6aI to select one of the blocks BLKIn, BLKIn−1 and BLKIn−2. The driver circuit 6aI selects one of the blocks BLKIn, BLKIn−1 and BLKIn−2 in accordance with an address which is input from the second internal address line.

In this way, it is possible to drive one of the decoders 6bOn to 6bOn−2 and one of the decoders 6bIn to 6bIn−2 and control the sense amplifier in the even-numbered column and the sense amplifier in the odd-numbered column independently. As a result, it becomes possible to implement the read or write operations in parallel on two different blocks in the same memory cell array 1.

Furthermore, for example, it is possible to conduct erase operations on one of the blocks BLKOn, BLKOn−1 and BLKOn−2 and one of the blocks BLKIn, BLKIn−1 and BLKIn−2 in parallel by driving one of the decoders 6bOn to 6bOn−2 and one of the decoders 6bIn to 6bIn−2 in parallel.

Figure 3:
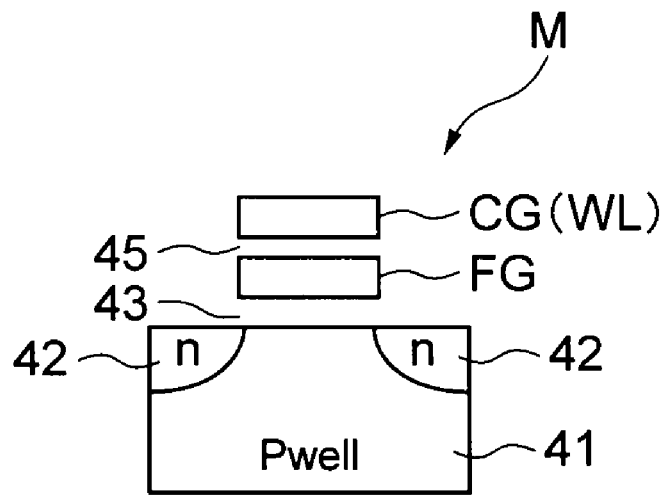
FIG. 3 is a sectional view showing a section of one memory cell transistor M in the memory cell array 1 shown in FIG. 2.

FIG. 3 is a sectional view showing a section of one memory cell transistor M in the memory cell array 1 shown in FIG. 2.

As shown in FIG. 3, the memory cell transistor M includes a floating gate FG, a control gate CG (WL), and a diffusion layer 42. The control gate CG is electrically connected to a word line WL, and the control gate CG is common among a plurality of memory cell transistors M.

The diffusion layer 42 which becomes a source-drain diffusion layer (which is an n+diffusion layer here) is formed in a well (which is a p-well here) 41 formed in a semiconductor substrate. A floating gate FG is formed over the well 41 via a gate insulation film (tunnel insulation film) 43. A control gate CG is formed over the floating gate FG via a gate insulation film 45.

The memory cell transistor M stores data according to a threshold voltage. And data stored in the memory cell transistor M can be rewritten by controlling the threshold voltage. The threshold voltage depends upon a charge quantity stored in the floating gate FG. The charge quantity in the floating gate FG can be changed by a tunnel current which passes through the gate insulation film 43.

In other words, if the control gate is provided with a voltage which is sufficiently high as compared with the well 41 and the diffusion layer (source diffusion layer/drain diffusion layer) 42, then electrons are injected into the floating gate FG through the gate insulation film 43. As a result, the threshold voltage of the memory cell transistor M becomes high (for example, which corresponds to a write state in the case where stored data is bi-valued).

On the other hand, if the well 41 and the diffusion layer (source diffusion layer/drain diffusion layer) 42 is provided with a voltage which is sufficiently high as compared with the control gate CG, then electrons are emitted from the floating gate FG through the gate insulation film 43. As a result, the threshold voltage of the memory cell transistor M becomes low (for example, which corresponds to an erased state in the case where stored data is bi-valued).

In this way, data stored in the memory cell transistor M can be rewritten by controlling the charge quantity stored in the floating gate FG.

Figure 4:
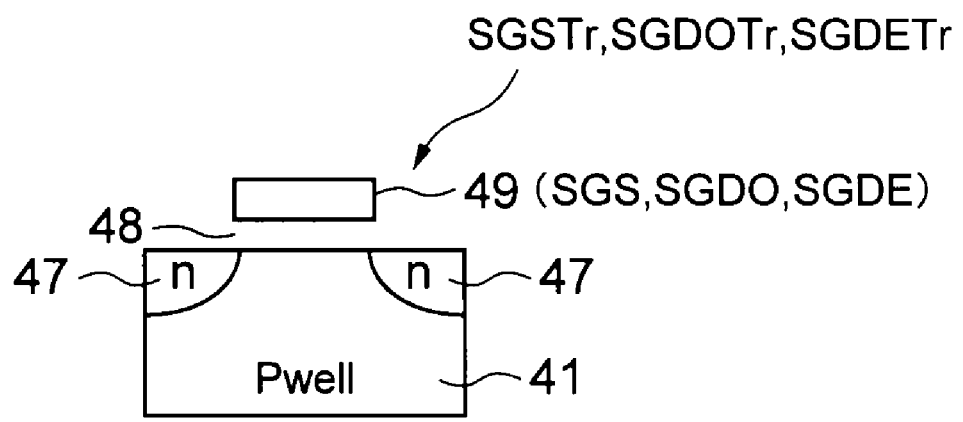
FIG. 4 is a sectional view showing a section of the drain side selection MOS transistors SGDETr and SGDOTr and the source side selection MOS transistor SGSTr in the memory cell array 1 shown in FIG. 2.

FIG. 4 is a sectional view showing a section of the drain side selection MOS transistors SGDETr and SGDOTr and the source side selection MOS transistor SGSTr in the memory cell array 1 shown in FIG. 2.

As shown in FIG. 4, a diffusion layer 47 which becomes a source diffusion layer/drain diffusion layer of the drain side selection MOS transistors SGDETr and SGDOTr and the source side selection MOS transistor SGSTr is formed in the well 41. A control gate 49 (the transfer MOS transistors SGS, SGDE and SGDO) is formed over the well 41 via a gate insulation film 48.

By the way, a well (substrate) in which the drain side selection MOS transistors SGDETr and SGDOTr, the source side selection MOS transistor SGSTr, and the aforementioned memory cell transistors M are formed and a well (substrate) in which the transfer MOS transistors TSG1, TSG2 and TWL0 to TWL63 (FIG. 2) are formed are subject to element isolation by using the STI (Shallow Trench Isolation) or the like.

Therefore, the substrate (well) voltage of the drain side selection MOS transistors SGDETr and SGDOTr, the source side selection MOS transistor SGSTr, and the memory cell transistors M and the substrate (well) voltage of the transfer MOS transistors TSGS, TSGDE, TSGDO, and TWL0 to TWLx can be controlled separately.

Figure 5:
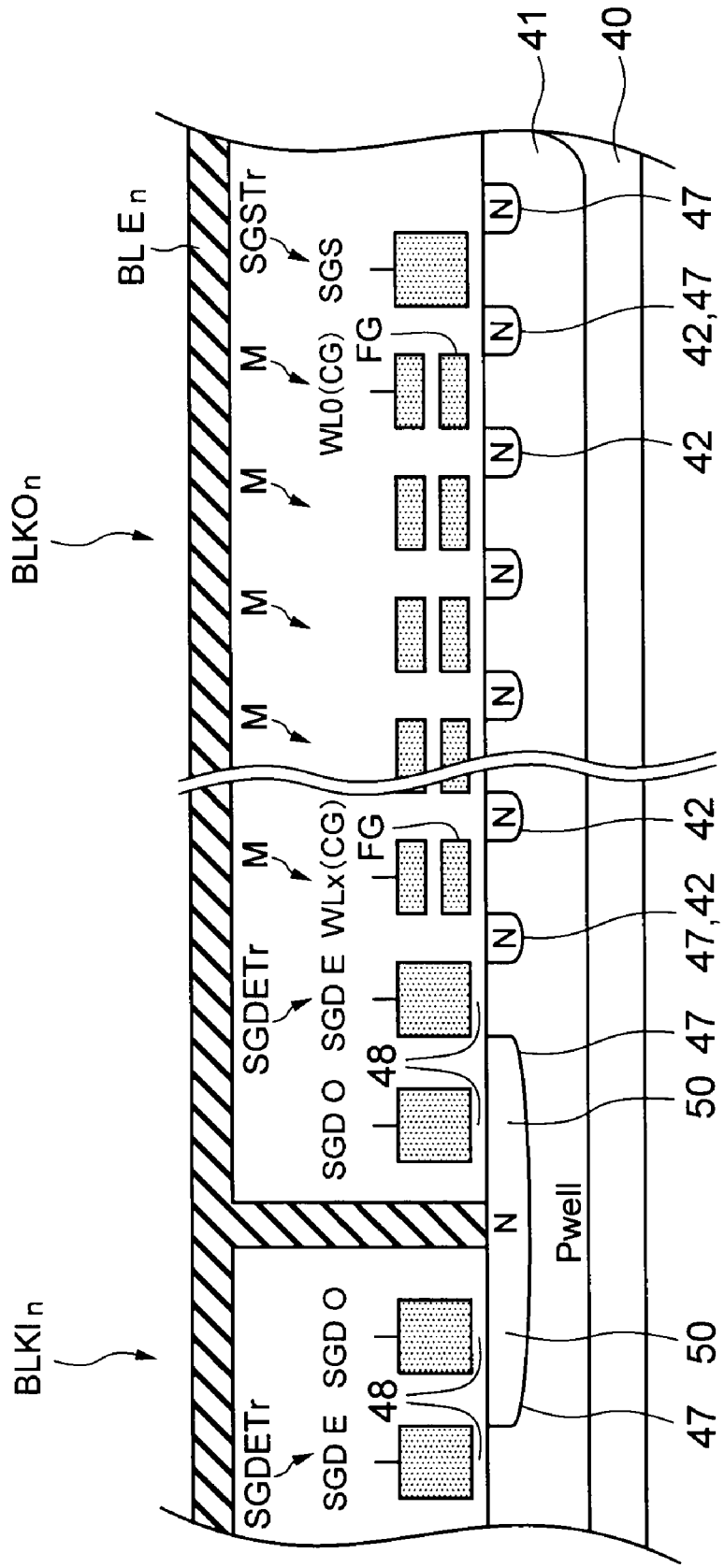
FIG. 5 is a sectional view of a vicinity of a NAND cell unit 1aE connected to a bit line BLEn of the block BLK0n shown in FIG. 2 obtained when seen along the bit line BLEn.
Figure 6:
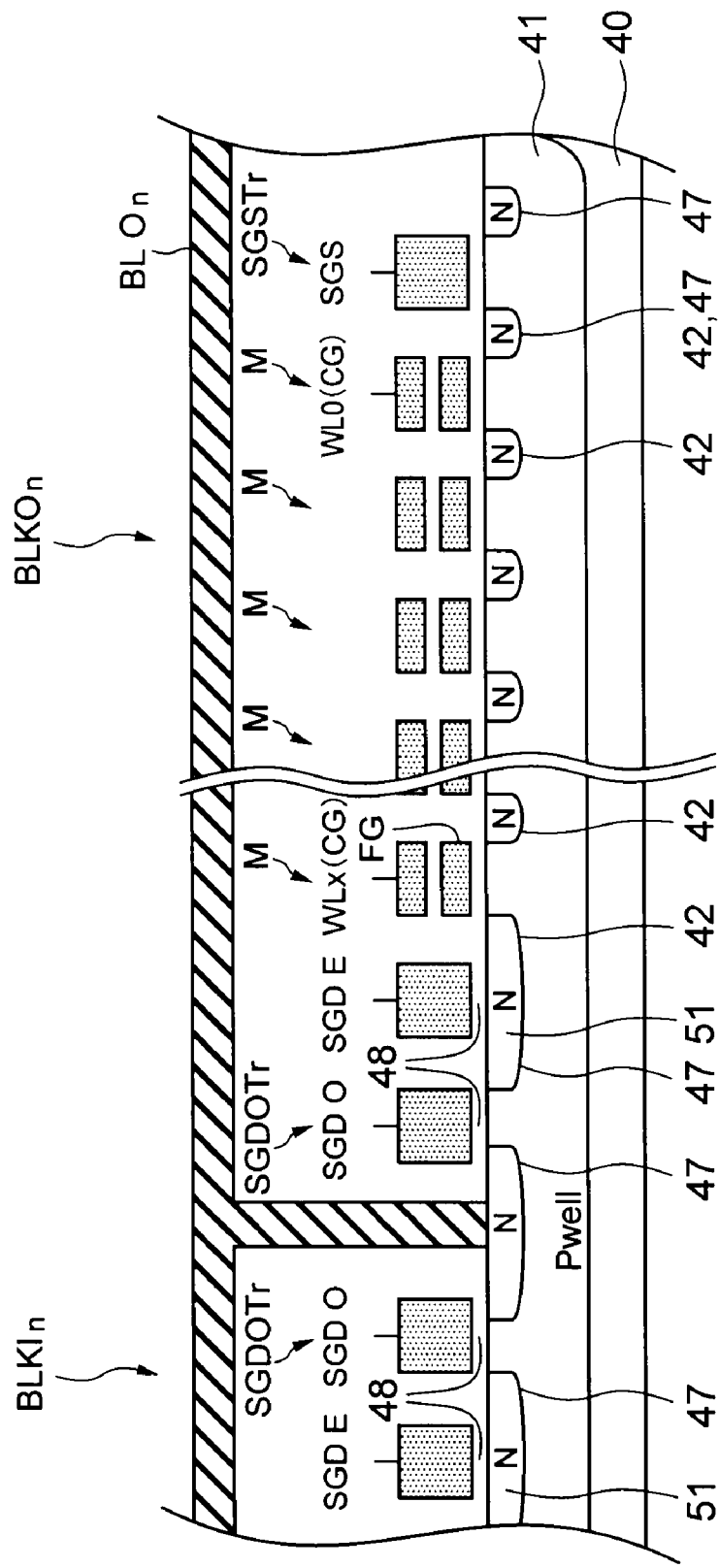
FIG. 6 is a sectional view of a vicinity of a NAND cell unit 1aO connected to a bit line BLOn of the block BLK0n shown in FIG. 2 obtained when seen along the bit line BLOn.
Figure 7:
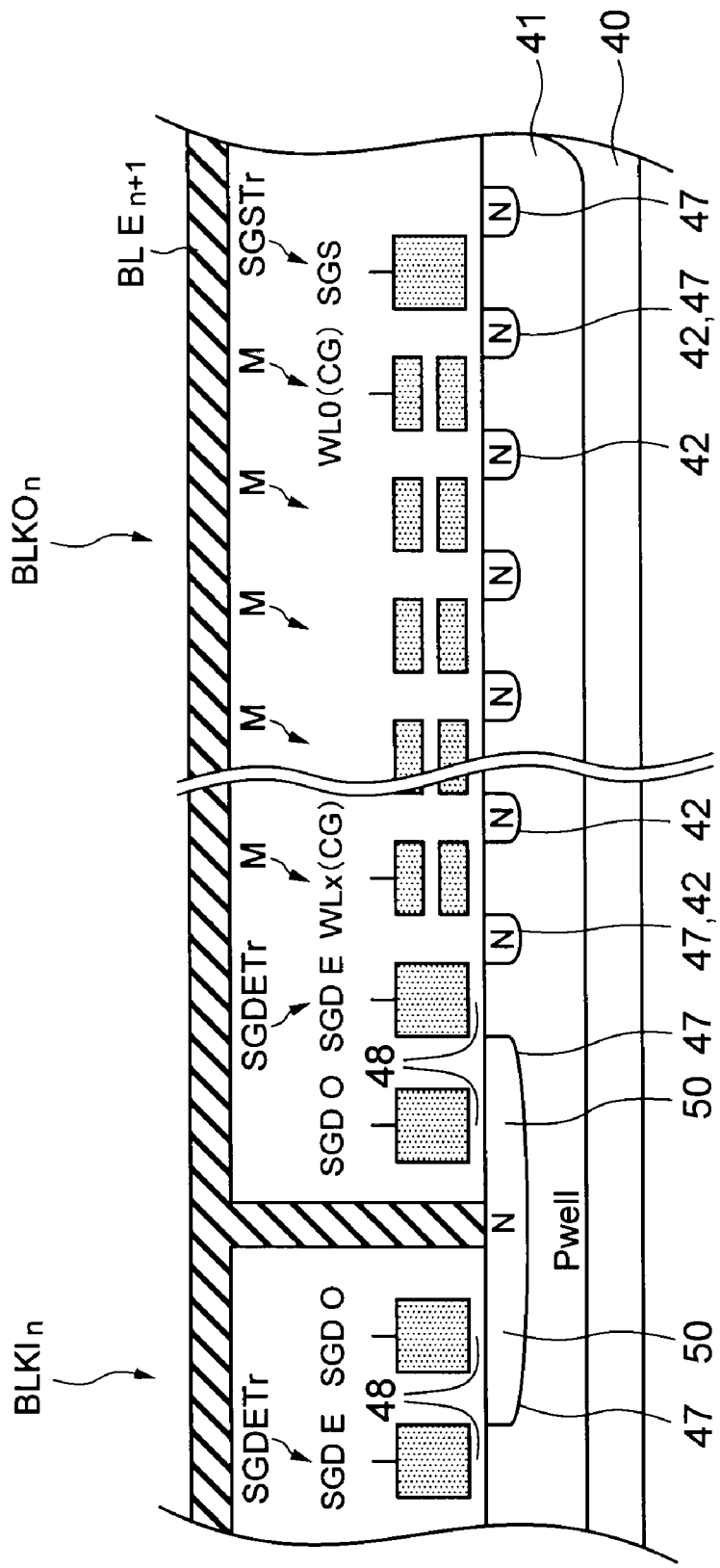
FIG. 7 is a sectional view of a vicinity of a NAND cell unit 1aE connected to a bit line BLEn+1 of the block BLK0n shown in FIG. 2 obtained when seen along the bit line BLEn+1.

FIG. 5 is a sectional view of a vicinity of a NAND cell unit 1aE connected to a bit line BLEn of the block BLKOn shown in FIG. 2 obtained when seen along the bit line BLEn. FIG. 6 is a sectional view of a vicinity of a NAND cell unit 1aO connected to a bit line BLOn of the block BLKOn shown in FIG. 2 obtained when seen along the bit line BLOn. FIG. 7 is a sectional view of a vicinity of a NAND cell unit 1aE connected to a bit line BLEn+1 of the block BLKOn shown in FIG. 2 obtained when seen along the bit line BLEn+1.

By the way, although a vicinity of the block BLKOn is focused as an example in FIGS. 5 to 7, other blocks have similar configurations.

As shown in FIG. 5, the plurality of memory cell transistors M are connected in series between the source diffusion layer 47 of the drain side selection MOS transistor SGDETr and the drain diffusion layer 47 of the source side selection MOS transistor SGSTr.

The drain side selection MOS transistor SGDETr is connected at its gate to the drain side selection gate line SGDE (i.e., the drain side selection MOS transistor SGDETr is common at its gate to the drain side selection gate line SGDE) and connected at its drain diffusion layers 47 and 50 to the bit line BLEn.

A part of the drain side selection gate line SGDO is located over the expanded drain diffusion layer 50 of the drain side selection MOS transistor SGDETr via the insulation film 48.

In the vicinity of a section along the bit line BLEn, therefore, the drain side selection gate line SGDO does not form a MOS transistor.

As shown in FIG. 6, a plurality of memory cell transistors M are connected in series between the source diffusion layers 47 and 51 of the drain side selection MOS transistor SGDOTr and the drain diffusion layer 47 of the source side selection MOS transistor SGSTr.

The drain side selection MOS transistor SGDOTr is connected at its gate to the drain side selection gate line SGDO (i.e., the drain side selection MOS transistor SGDOTr is common at its gate to the drain side selection gate line SGDO) and connected at its drain diffusion layer 47 to the bit line BLOn.

A part of the drain side selection gate line SGDE is located over the expanded drain diffusion layer 51 of the drain side selection MOS transistor SGDOTr via the insulation film 48.

In the vicinity of a section along the bit line BLOn, therefore, the drain side selection gate line SGDE does not form a MOS transistor.

As shown in FIG. 7, a plurality of memory cell transistors M are connected in series between the source diffusion layers 47 of the drain side selection MOS transistor SGDETr and the drain diffusion layer 47 of the source side selection MOS transistor SGSTr.

The drain side selection MOS transistor SGDETr is connected at its gate to the drain side selection gate line SGDE (i.e., the drain side selection MOS transistor SGDETr is common at its gate to the drain side selection gate line SGDE) and connected at its drain diffusion layers 47 and 50 to the bit line BLEn+1.

A part of the drain side selection gate line SGDE is located over the expanded drain diffusion layer 50 of the drain side selection MOS transistor SGDETr via the insulation film 48.

In the vicinity of a section along the bit line BLEn+1, therefore, the drain side selection gate line SGDO does not form a MOS transistor.

Figure 8:
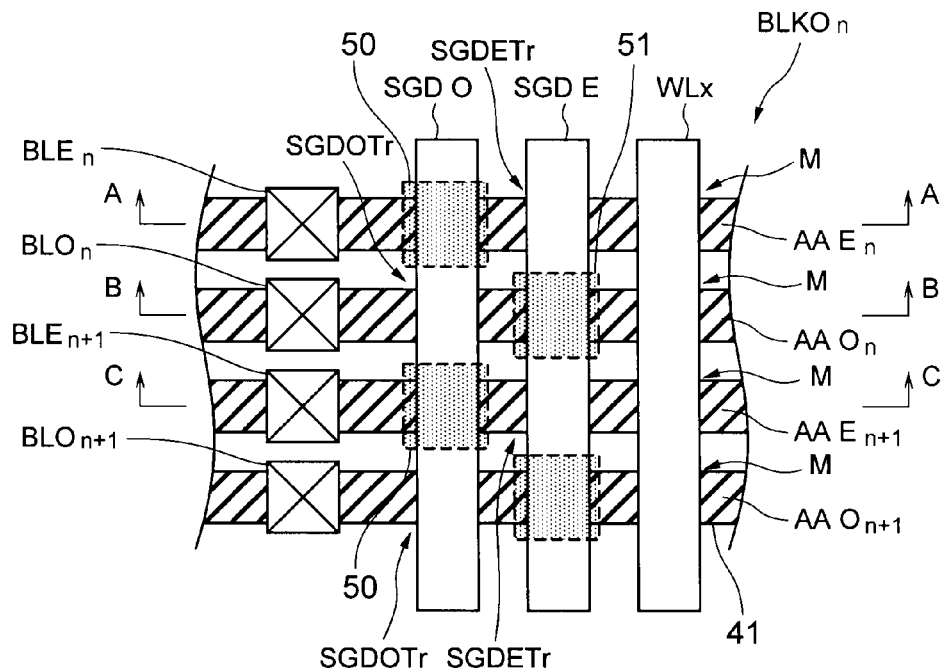
FIG. 8 is a plan view of the block BLK0n in the vicinity of the drain side selection MOS transistors SGDETr and SGDOTr.

FIG. 8 is a plan view of the block BLKOn in the vicinity of the drain side selection MOS transistors SGDETr and SGDOTr. As regards the bit lines BLEn, BLOn, BLEn+1 and BLOn+1, only contact parts are shown in FIG. 8 for brevity.

As shown in FIG. 8, element regions AAEn, AAEn+1, AAOn and AAOn+1 in the wells 41 are formed to extend in the bit line direction. These element regions AAEn, AAEn+1, AAOn and AAOn+1 are subject to element isolation from each other by using the STI or the like.

In the element regions AAEn and AAEn+1, a diffusion layer 50 is formed in regions which intersect the drain side selection gate line SGDO extending in the word line direction perpendicular to the bit line direction. In the same way, in the element regions AAOn and AAOn+1, a diffusion layer 51 is formed in regions which intersect the drain side selection gate line SGDE extending in the word line direction perpendicular to the bit line direction.

In this way, the diffusion layers 50 and 51 are formed in the wells 41 in a zigzag form. As shown in FIGS. 5 to 8, the blocks BLKOn and BLKIn are formed on the same well 41.

An example of operation of the NAND flash memory 100 having the configuration described heretofore will now be described.

Figure 9:
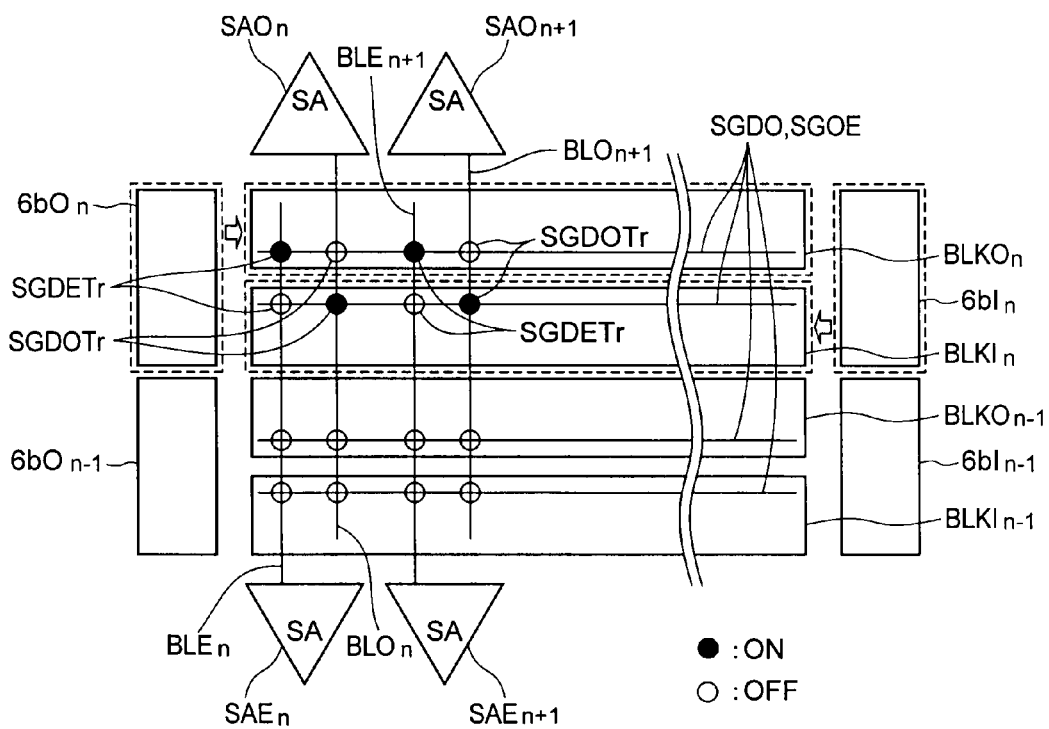
FIG. 9 is a diagram showing an example of a model of the on/off state of the drain side selection MOS transistors at the time of a write operation or a read operation of the NAND flash memory 100 shown in FIG. 2.
Figure 10:
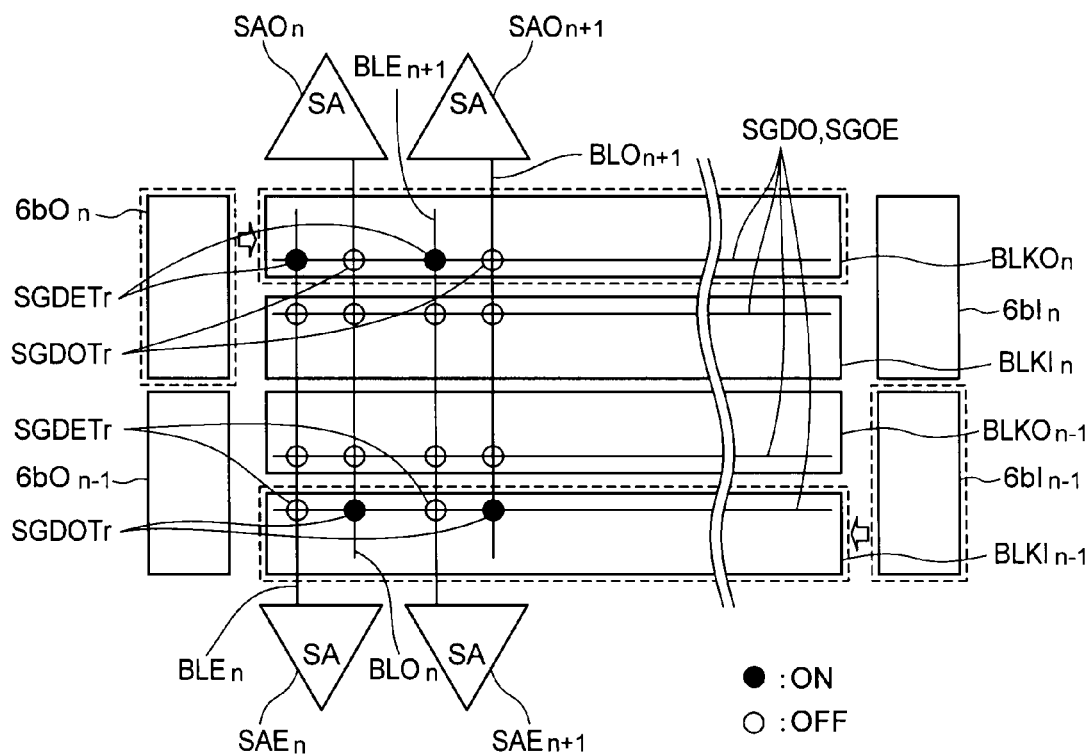
FIG. 10 is a diagram showing another example of a model of the on/off state of the drain side selection MOS transistors at the time of a write operation or a read operation of the NAND flash memory 100 shown in FIG. 2.

FIG. 9 is a diagram showing an example of a model of the on/off state of the drain side selection MOS transistors at the time of a write operation or a read operation of the NAND flash memory 100 shown in FIG. 2. FIG. 10 is a diagram showing another example of a model of the on/off state of the drain side selection MOS transistors at the time of a write operation or a read operation of the NAND flash memory 100 shown in FIG. 2.

In FIGS. 9 and 10, a configuration relating to the blocks BLKOn, BLKIn, BLKOn−1 and BLKIn−1 included in the configuration shown in FIG. 2 is shown for brevity. A black circle indicates that the drain side selection MOS transistor is in the on-state, whereas a white circle indicates that the drain side selection MOS transistor is in the off-state.

As shown in FIG. 9, the decoder 6bOn controls potentials on the drain side selection gate lines SGDO and SGDE in the block BLKOn, and the decoder 6bIn controls potentials on the drain side selection gate lines SGDO and SGDE in the block BLKIn.

In the block BLKOn, therefore, the drain side selection MOS transistor SGDETr turns on and the drain side selection MOS transistor SGDOTr turns off. In addition, in the block BLKIn, the drain side selection MOS transistor SGDETr turns off and the drain side selection MOS transistor SGDOTr turns on.

In other words, for the block BLKOn, the sense amplifiers SAEn and SAEn+1 in even-numbered columns are brought into the selected state. For the block BLKIn, the sense amplifiers SAOn and SAOn+1 in odd-numbered columns are brought into the selected state.

Therefore, the decoders 6bOn and 6bIn control potentials on the source side selection gate line SGS, the drain side selection gate lines SGDE and SGDO, and the word lines WL0 to WLx in accordance with the control signals of the first and second systems. As a result, the write operations or read operations can be controlled on two different blocks BLKOn and BLKIn in parallel.

Furthermore, the two decoders 6bOn and 6bIn control potentials on the source side selection gate line SGS, the drain side selection gate lines SGDE and SGDO, and the word lines WL0 to WLx in accordance with the control signals of the first and second systems. As a result, the erase operations can be controlled on all memory cell transistors in the two selected different blocks BLKOn and BLKIn in parallel.

As shown in FIG. 10, the decoder 6bOn controls potentials on the drain side selection gate lines SGDO and SGDE in the block BLKOn, and the decoder 6bIn−1 controls potentials on the drain side selection gate lines SGDO and SGDE in the block BLKIn−1.

In the block BLKOn, therefore, the drain side selection MOS transistor SGDETr turns on and the drain side selection MOS transistor SGDOTr turns off. In addition, in the block BLKIn−1, the drain side selection MOS transistor SGDETr turns off and the drain side selection MOS transistor SGDOTr turns on.

In other words, for the block BLKOn, the sense amplifiers SAEn and SAEn+1 in even-numbered columns are brought into the selected state. For the block BLKIn−1, the sense amplifiers SAOn and SAOn+1 in odd-numbered columns are brought into the selected state.

Therefore, the decoders 6bOn and 6bIn−1 control potentials on the source side selection gate line SGS, the drain side selection gate lines SGDE and SGDO, and the word lines WL0 to WLx in accordance with the control signals of the first and second systems. As a result, the write operations or read operations can be controlled on two different blocks BLKOn and BLKIn−1 in parallel.

Furthermore, the two decoders 6bOn and 6bIn−1 control potentials on the source side selection gate line SGS, the drain side selection gate lines SGDE and SGDO, and the word lines WL0 to WLx in accordance with the control signals of the first and second systems. As a result, the erase operations can be controlled on all memory cell transistors in the two selected different blocks BLKOn and BLKIn−1 in parallel.

Figure 11:
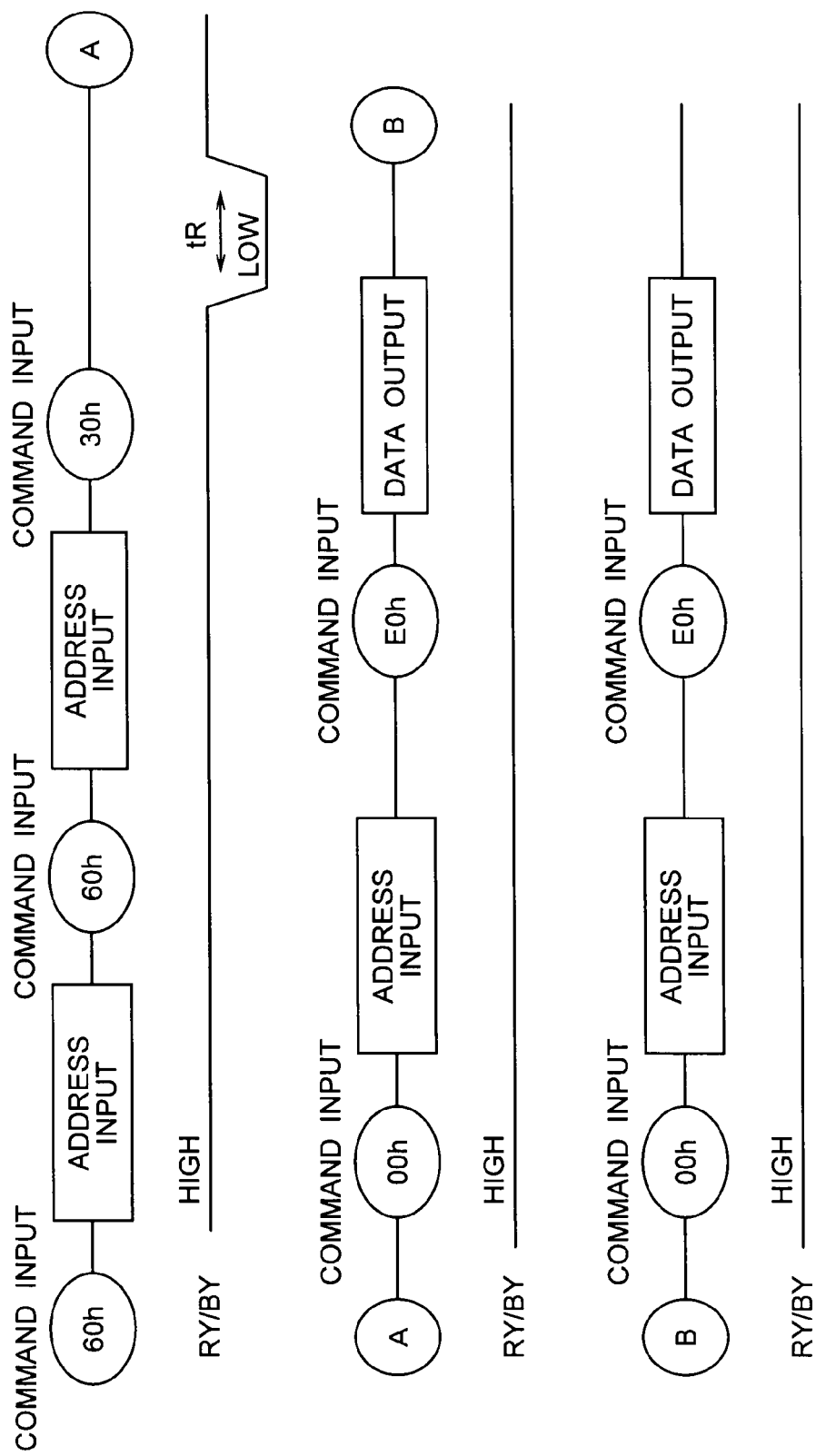
FIG. 11 is a flow diagram showing an example of relations between command inputs and operations of the NAND flash memory 100.

FIG. 11 is a flow diagram showing an example of relations between command inputs and operations of the NAND flash memory 100.

As shown in FIG. 11, a command 60h is first input to the control circuit 7 via the data input/output terminal 5 and the data input/output buffer 4. Subsequently, a page address "a" which specifies a first block and word line to be selected (row address) is input. The page address "a" specifies a sense amplifier in an even-numbered column as an address. And the row decoder 6 selects a block, a word line, and a sense amplifier in accordance with a control signal which is output from the control circuit 7.

Then, the command 60h is input to the control circuit 7 again via the data input/output terminal 5 and the data input/output buffer 4. Subsequently, a page address "b" which specifies a second block and word line (row address) to be selected is input. The page address "b" specifies a sense amplifier in an odd-numbered column as an address. And the row decoder 6 selects a block, a word line, and a sense amplifier in accordance with a control signal which is output from the control circuit 7.

Then, a command 30h is input to the control circuit 7 via the data input/output terminal 5 and the data input/output buffer 4. As a result, a ready/busy signal RY/BY changes from its "high" level to its "low" level. During a time period tR over which the ready/busy signal RY/BY is at the "low" level, the control circuit 7 controls the internal read operation. When data retained by a memory cell transistor M to be read is read out into a data storage circuit in the bit line control circuit 2, the ready/busy signal RY/BY changes from the "low" level to the "high" level.

Then, a command 00h is input to the control circuit 7 via the data input/output terminal 5 and the data input/output buffer 4. And a page address "a" specifying a first block which outputs data and a word line, and a column address specifying a sense amplifier in an even-numbered column which starts serial data output are input.

And when a command E0h is input to the control circuit 7 via the data input/output terminal 5 and the data input/output buffer 4, half of data corresponding to the page address "a" (which corresponds to the sense amplifier in the even-numbered column) is output via the bit line control circuit 2, the data input/output buffer 4 and the data input/output terminal 5 in accordance with a control signal which is output from the control circuit 7.

Then, the command 00h is input to the control circuit 7 again via the data input/output terminal 5 and the data input/output buffer 4. And a page address "b" specifying a second block which outputs data and a word line, and a column address specifying a sense amplifier in an odd-numbered column which starts serial data output are input.

And when the command E0h is input to the control circuit 7 again via the data input/output terminal 5 and the data input/output buffer 4, half of data corresponding to the page address "b" (which corresponds to the sense amplifier in the odd-numbered column) is output via the bit line control circuit 2, the data input/output buffer 4 and the data input/output terminal 5 in accordance with a control signal which is output from the control circuit 7.

In this way, data belonging to mutually different page addresses are read out from two different blocks in the same memory cell array. In the present embodiment, mainly the case where read operations are conducted in parallel has been described. As regards the write operation as well, however, it is possible in the same way to write data belonging to mutually different page addresses into two different blocks in the same memory cell array in parallel.

According to the NAND flash memory in the present embodiment, control operations such as reading or writings can be conducted on two different blocks in one memory cell array as described heretofore. Therefore, it is possible to provide a NAND flash memory which is also highly convenient for users who attach great importance to the access performance for the random page address besides a greater capacity.

(Second Embodiment)

In the first embodiment, an example of a configuration of a NAND flash memory which conducts control operations on an odd-numbered block and an even-numbered block in parallel has been described. In other words, the case where one block is selected from among even-numbered blocks BLKOn, BLKOn−1 and BLKOn−2 by the driver circuit 6aO disposed on the left side (outer side) of the memory cell array 1 and one block is selected from among odd-numbered blocks BLKIn, BLKIn−1 and BLKIn−2 by the driver circuit 6aI disposed on the right side (inner side) of the memory cell array 1 has been described.

In the present second embodiment, an example of a configuration of a NAND flash memory in which the restriction on block selection according to the first embodiment that parallel control operations are possible only on a pair of an odd-numbered block and an even-numbered block is removed and parallel control operations are made possible on two odd-numbered blocks or two even-numbered blocks as well will be described.

By the way, a general configuration of the NAND flash memory according to the second embodiment is the same as the configuration in the first embodiment shown in FIG. 1.

Figure 12:
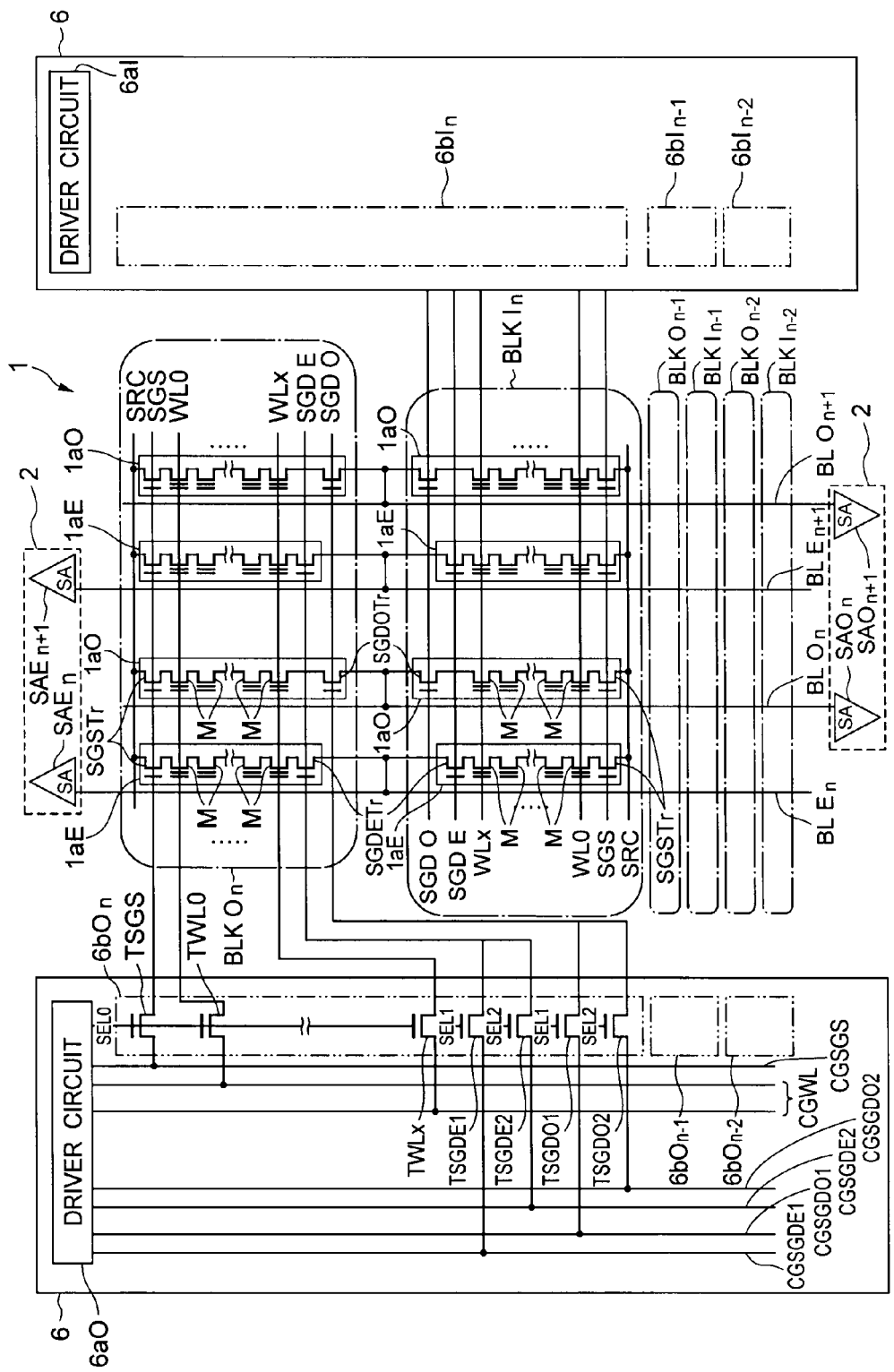
FIG. 12 is a circuit diagram showing an example of a configuration according to the second embodiment which includes the memory cell array 1, the bit line control circuit 2 and the row decoder 6 shown in FIG. 1.

FIG. 12 is a circuit diagram showing an example of a configuration according to the second embodiment which includes the memory cell array 1, the bit line control circuit 2 and the row decoder 6 shown in FIG. 1. In FIG. 12, the same characters as those in the first embodiment shown in FIG. 2 denote like components in the first embodiment. Although interconnections connected to the driver circuit 6aI in the right side row decoder 6 and circuit configurations of the decoders 6bIn, 6bIn−1 and 6bIn−2 are omitted in FIG. 12 for brevity, they are similar to the interconnections connected to the driver circuit 6aO in the left side row decoder 6 and the circuit configurations of the decoders 6bOn, 6bOn−1 and 6bOn−2.

As shown in FIG. 12, the configuration of the row decoder 6 is different from the configuration in the first embodiment shown in FIG. 2, and configurations of the memory cell array 1, the sense amplifiers SAEn, SAEn+1, SAOn and SAOn+1 are the same as those in the first embodiment shown in FIG. 2.

The row decoder 6 includes driver circuits 6aO and 6aI, a plurality of (block) decoders 6bOn, 6bOn−1, 6bOn−2, 6bIn, 6bIn−1 and 6bIn−2, and control lines CGSGS, CGSGDE, CGSGDO and CGWL. Furthermore, select lines SEL0, SEL1 and SEL2 are disposed in each of decoders 6bOn, 6bOn−1, 6bOn−2, 6bIn, 6bIn−1 and 6bIn−2.

The decoder 6bOn corresponds to the block BLKOn, and includes a plurality of transfer MOS transistors TSGS, TSGDE1, TSGDE2, TSGDO1, TSGDO2, and TWL0 to TWLx, which are nMOS transistors. In the same way, the decoders 6bOn+1 to 6bOn−2 and 6bIn to 6bIn−2 respectively correspond to the blocks BLKOn, BLKIn, BLKOn−1, BLKIn−1, BLKOn−2 and BLKIn−2, and include a plurality of transfer MOS transistors, which are nMOS transistors.

In FIG. 12, only the transfer MOS transistors TWL0 and TWLx are shown as transistors connected to the word lines in the decoder 6bOn for brevity, and transfer MOS transistors arranged between them are omitted.

Drains of the transfer MOS transistors TSGS, TSGDE1, TSGDE2, TSGDO1 and TSGDO2 are connected to the source side selection gate line SGS, and the drain side selection gate lines SGDE and SGDO, respectively. Drains of the transfer MOS transistors TWL0 to TWLx are connected respectively to the word lines WL0 to WLx, which are connected to control gates of the memory cell transistors M.

Sources of the transfer MOS transistors TSGS, TSGDE1, TSGDE2, TSGDO1, TSGDO2 and TWL0 to TWLx are connected respectively to the control lines CGSGS, CGSGDE1, CGSGDE2, CGSGDO1, CGSGDO2 and CGWL, which are connected to the driver circuit 6aO.

In other words, the control lines CGSGS, CGSGDE1, CGSGDE2, CGSGDO1, CGSGDO2 and CGWL are arranged to be common to the decoders 6bOn, 6bOn−1 and 6bOn−2. In the same way, the control lines are arranged to be common to the decoders 6bIn, 6bIn−1 and 6bIn−2.

Furthermore, the driver circuit 6aO is adapted to control gate voltage and source voltages of the transfer MOS transistors TSGS, TSGDE1, TSGDE2, TSGDO1, TSGDO2 and TWL0 to TWLx according to the output of the control circuit 7.

In other words, the row decoder 6 controls the transfer MOS transistors TSGS, TSGDE1, TSGDE2, TSGDO1, TSGDO2 and TWL0 to TWLx in the decoders 6bOn to 6bOn−2 by controlling the gate voltage and the source voltages in the driver circuit 6aO.

For example, the driver circuit 6aO brings potentials on the select lines SEL0 and SEL1 in the decoder 6bOn to the "high" level and brings the potential on the select line SEL2 in the decoder 6bOn to the "low" level. As a result, the transfer MOS transistors TSGS, TSGDE1, TSGDO1 and TWL0 to TWLx in the decoder 6bOn turn on, and the transfer MOS transistors TSGDE2 and TSGDO2 in the decoder 6bOn turn off. The control line CGSGDE1 is electrically connected to the gate of the drain side selection MOS transistor SGDETr in the block BLKOn, and the control line CGSGDO1 is electrically connected to the gate of the drain side selection MOS transistor SGDOTr. In addition, the drain side selection MOS transistors SGDOTr and SGDETr can be controlled to turn on or off by controlling potentials on the control lines CGSGDE1 and CGSGDO1.

As described heretofore, an even-numbered block BLK0n is selected, and it becomes possible to conduct reading and writing by using the sense amplifiers SAEn and SAEn+1 in an even-numbered column.

In the same way, the driver circuit 6aO brings the potential on the select lines SEL0 and SEL2 in the decoder 6bOn−1 to the "high" level and the potential on the select line SEL1 in the decoder 6bOn to the "low" level in parallel. As a result, the transfer MOS transistors TSGS, TSGDE2, TSGDO2 and TWL0 to TWLx in the decoder 6bOn−1 turn on, and the transfer MOS transistors TSGDE1 and TSGDO1 in the decoder 6bOn−1 turn off. The control line CGSGDE2 is electrically connected to the gate of the drain side selection MOS transistor SGDETr in the block BLKOn−1, and the control line CGSGDO2 is electrically connected to the gate of the drain side selection MOS transistor SGDOTr. In addition, the drain side selection MOS transistors SGDOTr and SGDETr can be controlled to turn on or off by controlling potentials on the control lines CGSGDE2 and CGSGDO2.

As described heretofore, an even-numbered block BLKOn−1 is selected in parallel to the even-numbered block BLKOn, and it becomes possible to conduct reading and writing by using the sense amplifiers SAOn and SAOn+1 in an odd-numbered column.

In other words, the driver circuit 6aO can select two blocks from among even-numbered blocks BLKOn, BLKOn−1 and BLKOn−2 in the memory cell array 1 and control write operations and read operations on the selected blocks. In the present second embodiment, the control lines CGSGDE and CGSGDO included in the control signals of the first system which are output from the driver circuit 6aO are further divided into two systems: the control lines CGSGDE1 and CGSGDE2; and the control lines CGSGDO1 and CGS-GDO2. In addition, double switches (the transfer MOS transistors TSGDE1, TSGDE2, TSGDO1 and TSGDO2) are provided in each of the decoders 6bOn, 6bOn−1 and 6bOn−2, and exclusive control is exercised. As a result, multiple selection by the driver circuits on the same side is implemented.

In this way, two decoders among the decoders 6bOn to 6bOn−2 are driven, and a sense amplifier in an even-numbered column and a sense amplifier in an odd-numbered column can be controlled independently. As a result, one block is selected from among even-numbered blocks BLKOn, BLKOn−1 and BLKOn−2 by the driver circuit 6aO disposed on the left side (outer side) of the memory cell array 1, and one block is selected from among odd-numbered blocks BLKIn, BLKIn−1 and BLKIn−2 by the driver circuit 6aI disposed on the right side (inner side) of the memory cell array 1. In addition, it becomes possible to implement read operations or write operations in parallel on two blocks selected from among the even-numbered blocks BLKOn, BLKOn−1 and BLKOn−2 by the left side driver circuit 6aO.

Furthermore, erase operations can be conducted on two blocks selected from among the blocks BLKOn, BLKOn−1 and BLKOn−2 in parallel by, for example, driving two decoders selected from among the decoders 6bOn to 6bOn−2 in parallel.

Control operation on the decoders 6bIn to 6bIn−2 is the same as that on the decoders 6bOn to 6bOn−2. In other words, one block is selected from among even-numbered blocks BLKOn, BLKOn−1 and BLKOn−2 by the driver circuit 6aO disposed on the left side (outer side) of the memory cell array 1, and one block is selected from among odd-numbered blocks BLKIn, BLKIn−1 and BLKIn−2 by the driver circuit 6aI disposed on the right side (inner side) of the memory cell array 1. In addition, it becomes possible to implement read operations or write operations in parallel on two blocks selected from among the odd-numbered blocks BLKIn, BLKIn−1 and BLKIn−2 by the right side driver circuit 6aI.

Figure 13:
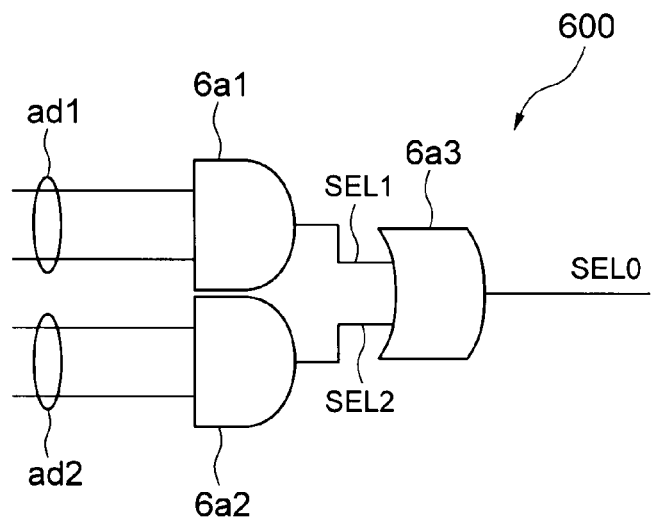
FIG. 13 is a diagram showing an example of a configuration of a logic circuit 600 which generates selection signals SEL0, SEL1 and SEL2 in the driver circuit shown in FIG. 12.

FIG. 13 is a diagram showing an example of a configuration of a logic circuit 600 which generates selection signals SEL0, SEL1 and SEL2 in the driver circuit shown in FIG. 12. For implementing the above-described multiple selection operation, it is necessary to divide each of the internal address lines as well into two systems for each of the driver circuits 6aO and 6aI. In other words, the first internal address line which is described in the first embodiment and which is not illustrated is divided into two systems: address lines ad1 and ad2, and the second internal address line is also divided into two systems: ad1 and ad2, in the same way. The address line ad1 is activated in accordance with the page address "a" for specifying the first block and a word line to be selected which is described with reference to FIG. 11, and the address line ad2 is activated in accordance with the page address "b" for specifying the second block and a word line to be selected which is described with reference to FIG. 11

As shown in FIG. 13, the logic circuit 600 includes an AND circuit 6a1 connected at its inputs to an address line ad1 and connected at its output to a select line SEL1, an AND circuit 6a2 connected at its inputs to an address line ad2 and connected at its output to a select line SEL2, and an OR circuit 6a3 connected at its inputs to the select lines SEL1 and SEL2 and connected at its output to a select line SEL0. The logic circuit 600 is provided in the driver circuits 6aO and 6aI in association with the decoders 6bOn to 6bOn−2 and 6bIn to 6bIn−2.

For example, the logic circuit 600 corresponding to the decoder 6bOn will now be described. If the page address "a" which is input from the outside specifies the block BLKOn, then the address line ad1 is activated and the potential on the select line SEL1 becomes the "high" level whereas the address line ad2 is not activated and the potential on the select line SEL2 becomes the "low" level. Therefore, the potential on the select line SEL0 becomes the "high" level. As a result, the block BLKOn is selected.

At this time, the control line CGSGDE1 is provided with a potential of the "high" level and the control line CGSGDO1 is provided with a potential of the "low" level by the driver circuit 6aO. The transfer MOS transistors TSGS, TSGDE1, TSGDO1, and TWL0 to TWLX in the decoder 6bOn are in the on-state, and the transfer MOS transistors TSGDE2 and TSGDO2 in the decoder 6bOn are in the off-state. Therefore, potentials on the control lines CGSGS, CGWL, CGSGDE1 and CGSGDO1 are transferred, and read operation and write operation can be implemented by the sense amplifiers SAEn and SAEn+1 in the even-numbered column.

For example, the logic circuit 600 corresponding to the decoder 6bOn−1 will now be described. If the page address "b" which is input from the outside specifies the block BLKOn, then the address line ad2 is activated and the potential on the select line SEL2 becomes the "high" level whereas the address line ad1 is not activated and the potential on the select line SEL1 becomes the "low" level. Therefore, the potential on the select line SEL0 becomes the "high" level. As a result, the block BLKOn−1 is selected.

At this time, the control line CGSGDE2 is provided with a potential of the "high" level and the control line CGSGDO2 is provided with a potential of the "low" level by the driver circuit 6aO. The transfer MOS transistors TSGS, TSGDE2, TSGDO2, and TWL0 to TWLx in the decoder 6bOn are in the on-state, and the transfer MOS transistors TSGDE1 and TSGDO1 in the decoder 6bOn are in the off-state. Therefore, potentials on the control lines CGSGS, CGWL, CGSGDE2 and CGSGDO2 are transferred, and read operation and write operation can be implemented by the sense amplifiers SAOn and SAOn+1 in the odd-numbered column.

An example of operation of the NAND flash memory 100 having the configuration described heretofore will now be described.

Figure 14:
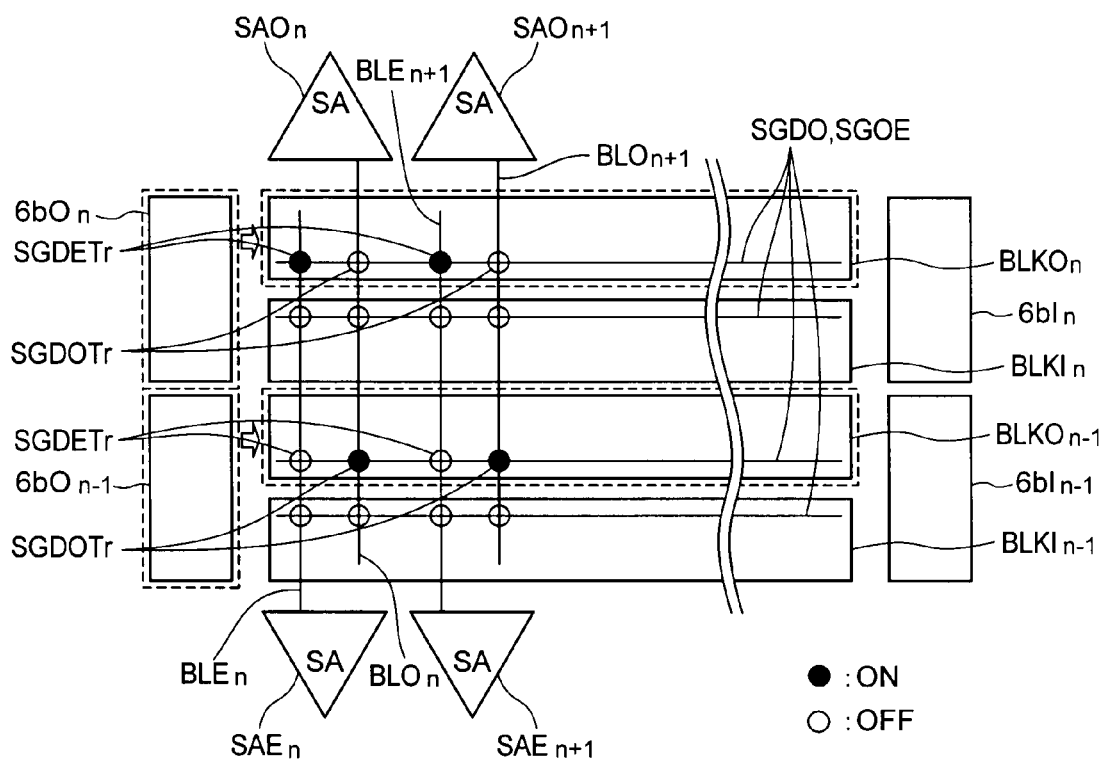
FIG. 14 is a diagram showing an example of a model of the on/off state of the drain side selection MOS transistors at the time of a write operation or a read operation of the NAND flash memory 100 shown in FIG. 12.
Figure 15:
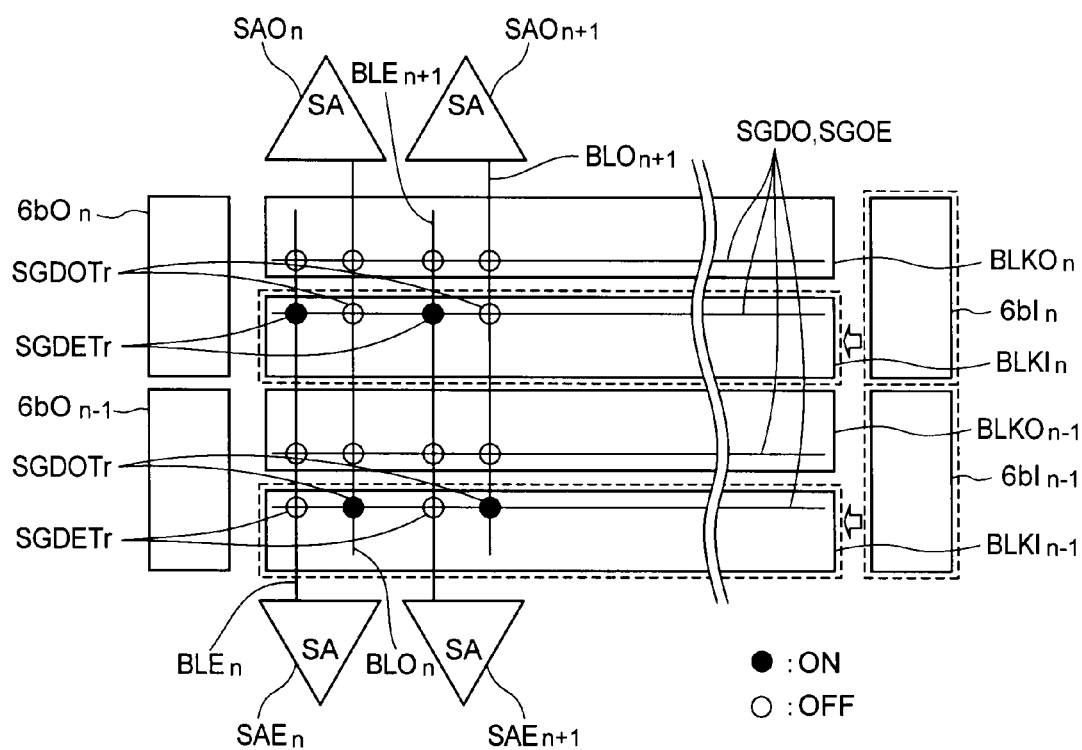
FIG. 15 is a diagram showing another example of a model of the on/off state of the drain side selection MOS transistors at the time of a write operation or a read operation of the NAND flash memory 100 shown in FIG. 12.

FIG. 14 is a diagram showing an example of a model of the on/off state of the drain side selection MOS transistors at the time of a write operation or a read operation of the NAND flash memory 100 shown in FIG. 12. FIG. 15 is a diagram showing another example of a model of the on/off state of the drain side selection MOS transistors at the time of a write operation or a read operation of the NAND flash memory 100 shown in FIG. 12.

In FIGS. 14 and 15, a configuration relating to the blocks BLKOn, BLKIn, BLKOn+1 and BLKIn+1 included in the configuration shown in FIG. 12 is shown for brevity. A black circle indicates that the drain side selection MOS transistor is in the on-state, whereas a white circle indicates that the drain side selection MOS transistor is in the off-state.

As shown in FIG. 14, the decoder 6bOn controls potentials on the drain side selection gate lines SGDO and SGDE in the block BLKOn, and the decoder 6bOn−1 controls potentials on the drain side selection gate lines SGDO and SGDE in the block BLKOn−1.

In the block BLKOn, therefore, the drain side selection MOS transistor SGDETr turns on and the drain side selection MOS transistor SGDOTr turns off. In addition, in the block BLKOn−1, the drain side selection MOS transistor SGDETr turns off and the drain side selection MOS transistor SGDOTr turns on.

In other words, for the block BLKOn, the sense amplifiers SAEn and SAEn+1 in even-numbered columns are brought into the selected state. For the block BLKOn−1, the sense amplifiers SAOn and SAOn+1 in odd-numbered columns are brought into the selected state.

Among the control signals of the first system, therefore, each of at least the control lines CGSGDE and CGSGDO is further divided into two different systems. The first internal address line is also divided into two systems: the address lines ad1 and ad2. The decoders 6bOn and 6bOn−1 control potentials on the source side selection gate line SGS, the drain side selection gate lines SGDE and SGDO, and the word lines WL0 to WLx. As a result, the write operations or read operations can be controlled on two different blocks BLKOn and BLKOn−1 in parallel.

Among the control signals of the first system, therefore, each of at least the control lines CGSGDE and CGSGDO is further divided into two different systems. The first internal address line is also divided into two systems: the address lines ad1 and ad2. The decoders 6bOn and 6bOn−1 control potentials on the source side selection gate line SGS, the drain side selection gate lines SGDE and SGDO, and the word lines WL0 to WLx. As a result, the erase operations can be controlled on all memory cell transistors in two selected different blocks BLKOn and BLKOn−1 in parallel.

As shown in FIG. 15, the decoder 6bIn controls potentials on the drain side selection gate lines SGDO and SGDE in the block BLKIn, and the decoder 6bIn−1 controls potentials on the drain side selection gate lines SGDO and SGDE in the block BLKIn−1.

In the block BLKIn, therefore, the drain side selection MOS transistor SGDETr turns on and the drain side selection MOS transistor SGDOTr turns off. In addition, in the block BLKIn−1, the drain side selection MOS transistor SGDETr turns off and the drain side selection MOS transistor SGDOTr turns on.

In other words, for the block BLKIn, the sense amplifiers SAEn and SAEn+1 in even-numbered columns are brought into the selected state. For the block BLKIn−1, the sense amplifiers SAOn and SAOn+1 in odd-numbered columns are brought into the selected state.

Among the control signals of the second system, therefore, each of at least the control lines CGSGDE and CGSGDO is further divided into two different systems. The second internal address line is also divided into two systems: the address lines ad1 and ad2. The decoders 6bIn and 6bIn−1 control potentials on the source side selection gate line SGS, the drain side selection gate lines SGDE and SGDO, and the word lines WL0 to WLx. As a result, the write operations or read operations can be controlled on two different blocks BLKIn and BLKIn−1 in parallel.

Among the control signals of the second system, each of at least the control lines CGSGDE and CGSGDO is further divided into two different systems. The second internal address line is also divided into two systems: the address lines ad1 and ad2. The two decoders 6bIn and 6bIn−1 control potentials on the source side selection gate line SGS, the drain side selection gate lines SGDE and SGDO, and the word lines WL0 to WLx. As a result, the erase operations can be controlled on all memory cell transistors in two selected different blocks BLKIn and BLKIn−1 in parallel.

According to the NAND flash memory in the present embodiment, control operations such as reading or writings can be conducted in parallel on two different blocks in one memory cell array as described heretofore.

Furthermore, according to NAND flash memory in the present embodiment, driver circuits are disposed on both sides of the memory cell array to cause a driver circuit on the first side and a driver circuit on the second side to conduct block selection alternately and control operations can be conducted in parallel not only in the case where a driver circuit on the first side and a driver circuit on the second side conduct multiple selection of blocks but also in the case where driver circuits on the first side conduct multiple selection of blocks or driver circuits on the second side conduct multiple selection of blocks.

(Third Embodiment)

In the second embodiment, an example of a configuration of a NAND flash memory capable of conducting control operations in parallel on two odd-numbered blocks or two even-numbered blocks in parallel has been described.

In the present third embodiment, an example of a configuration of a NAND flash memory capable of conducting control operations on potentials applied to word lines for two odd-numbered blocks or two even-numbered blocks will be described as application of the second embodiment.

A general configuration of the NAND flash memory according to the present third embodiment is similar to that in the first embodiment shown in FIG. 1.

Figure 16:
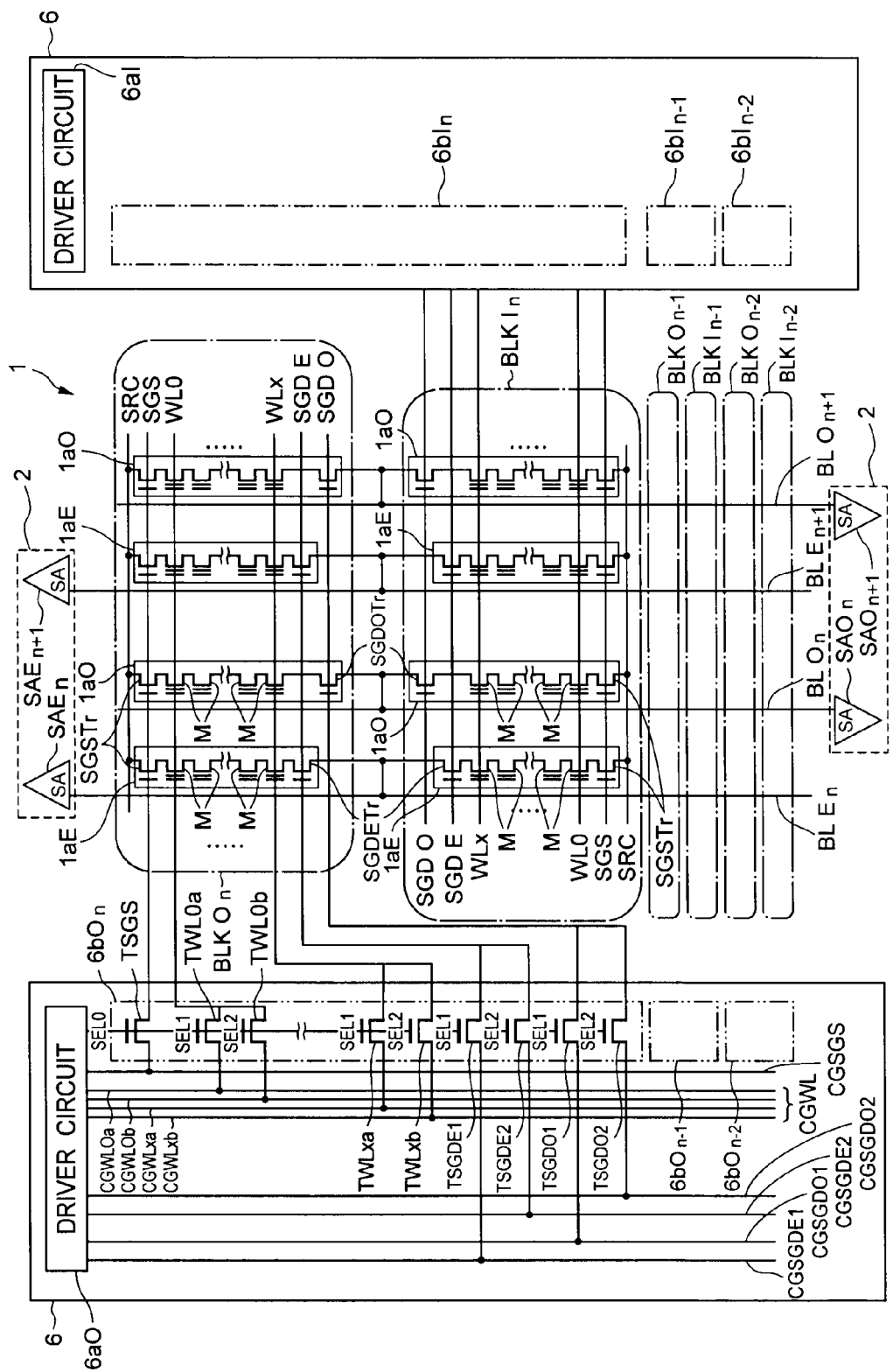
FIG. 16 is a circuit diagram showing an example of a configuration according to the third embodiment which includes the memory cell array 1, the bit line control circuit 2 and the row decoder 6 shown in FIG. 1.

FIG. 16 is a circuit diagram showing an example of a configuration according to the third embodiment which includes the memory cell array 1, the bit line control circuit 2 and the row decoder 6 shown in FIG. 1. In FIG. 16, the same characters as those in the second embodiment shown in FIG. 12 denote like components in the second embodiment. Although interconnections connected to the driver circuit 6aI in the right side row decoder 6 and circuit configurations of the decoders 6bIn, 6bIn−1 and 6bIn−2 are omitted in FIG. 16 for brevity, they are similar to the interconnections connected to the driver circuit 6aO in the left side row decoder 6 and the circuit configurations of the decoders 6bOn, 6bOn−1 and 6bOn−2.

As shown in FIG. 16, the configuration of the row decoder 6 is different from the configuration in the second embodiment shown in FIG. 12, and configurations of the memory cell array 1, the sense amplifiers SAEn, SAEn+1, SAOn and SAOn+1 are the same as those in the first embodiment shown in FIG. 2.

The row decoder 6 includes driver circuits 6aO and 6aI, a plurality of (block) decoders 6bOn, 6bOn−1, 6bOn−2, 6bIn, 6bIn−1 and 6bIn−2, and control lines CGSGS, CGSGDE, CGSGDO and CGWL. The control line CGWL includes control lines CGWL0a, CGWL0b, CGWLxa and CGWLxb. Furthermore, select lines SEL0, SEL1 and SEL2 are disposed in each of decoders 6bOn, 6bOn−1, 6bOn−2, 6bIn, 6bIn−1 and 6bIn−2.

The decoder 6bOn corresponds to the block BLKOn, and includes a plurality of transfer MOS transistors TSGS, TSGDE1, TSGDE2, TSGDO1, TSGDO2, TWL0a, TWL0b to TWLxa and TWL0b, which are nMOS transistors.

In the same way, the decoders 6bOn+1 to 6bOn−2 and 6bIn to 6bIn−2 respectively correspond to the blocks BLKOn, BLKIn, BLKOn−1, BLKIn−1, BLKOn−2 and BLKIn−2, and include a plurality of transfer MOS transistors, which are nMOS transistors.

In other words, the 6bOn to 6bOn−2 and 6bIn to 6bIn−2 in the third embodiment differs from the second embodiment in that the number of transfer MOS transistors connected to one word line is two.

In FIG. 16, only the transfer MOS transistors TWL0a, TWL0b, TWLxa and TWLxb are shown as transistors connected to the word lines in the decoder 6bOn for brevity, and transfer MOS transistors arranged between them are omitted.

Drains of the transfer MOS transistors TWL0a and TWL0b are connected to the word line WL0, which is connected to control gates of the memory cell transistors M. Drains of the transfer MOS transistors TWLxa and TWLxb are connected to the word line WLx, which is connected to control gates of the memory cell transistors M.

Sources of the transfer MOS transistors TWL0a, TWL0b, TWLxa and TWLxb are connected respectively to the control lines CGWL0a, CGWL0b, CGWLxa and CGWLxb, which are connected to the driver circuit 6aO.

The remaining configuration of the row decoder 6 in the third embodiment is the same as that of the row decoder 6 in the second embodiment.

The driver circuit 6aO is adapted to control gate voltage and source voltages of the transfer MOS transistors TSGS, TSGDE1, TSGDE2, TSGDO1, TSGDO2 and TWL0a to TWLxb according to the output of the control circuit 7.

In other words, the row decoder 6 controls the transfer MOS transistors TSGS, TSGDE1, TSGDE2, TSGDO1, TSGDO2 and TWL0a to TWLxb in the decoders 6bOn to 6bOn−2 by controlling the gate voltage and the source voltages in the driver circuit 6aO.

For example, the driver circuit 6aO brings potentials on the select lines SEL0 and SEL1 in the decoder 6bOn to the "high" level and brings the potential on the select line SEL2 in the decoder 6bOn to the "low" level. As a result, the transfer MOS transistors TWL0a and TWLxa in the decoder 6bOn turn on, and the transfer MOS transistors TWL0b and TWLxb in the decoder 6bOn turn off.

As a result, the word line WL0 in the block BLKOn is electrically connected to the control line CGWL0a and the word line WLx is electrically connected to the control line CGWLxa. In addition, potentials on the word lines WL0 and WLx in the block BLKOn can be controlled by controlling potentials on the control lines CGWL0a and CGWLxa.

In the same way, the driver circuit 6aO brings the potential on the select lines SEL0 and SEL2 in the decoder 6bOn−1 to the "high" level and the potential on the select line SEL1 in the decoder 6bOn−1 to the "low" level. As a result, the transfer MOS transistors TWL0b and TWLxb in the decoder 6bOn−1 turn on, and the transfer MOS transistors TWL0a and TWLxa in the decoder 6bOn turn off.

As a result, the word line WL0 in the block BLKOn−1 is electrically connected to the control line CGWL0b and the word line WLx is electrically connected to the control line CGWLxb. In addition, potentials on the word lines WL0 and WLx in the block BLKOn−1 can be controlled by controlling potentials on the control lines CGWL0b and CGWLxb.

Remaining operation of the row decoder 6 in the third embodiment is the same as that of the row decoder 6 in the second embodiment.

According to the NAND flash memory in the present embodiment, control operations such as reading or writings can be conducted in parallel on two different blocks in one memory cell array in the same way as the second embodiment as described heretofore. In addition, two different blocks in one memory cell array can be controlled to have different potentials on word lines.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A NAND flash memory having a memory cell array formed of a plurality of blocks including memory cell transistors, the NAND flash memory comprising:
   a first bit line;
   a first sense amplifier connected to the first bit line, the first sense amplifier sensing or controlling a potential on the first bit line;
   a second bit line;
   a second sense amplifier connected to the second bit line, the second sense amplifier sensing or controlling a potential on the second bit line;
   a first drain side selection gate line;
   a second drain side selection gate line;
   a third drain side selection gate line;
   a fourth drain side selection gate line;
   a first source side selection gate line;
   a second source side selection gate line;
   a first block comprising:
      a first drain side selection MOS transistor connected at a gate thereof to the first drain side selection gate line and connected at a drain diffusion layer thereof to the first bit line,
      a first source side selection MOS transistor connected at a gate thereof to the first source side selection gate line,
      a plurality of first memory cell transistors connected in series between the source diffusion layer of the first drain side selection MOS transistor and the drain diffusion layer of the first source side selection MOS transistor, a second drain side selection MOS transistor connected at a gate thereof to the second drain side selection gate line and connected at a drain diffusion layer thereof to the second bit line, a second source side selection MOS transistor connected at a gate thereof to the first source side selection gate line, and a plurality of second memory cell transistors connected in series between the source diffusion layer of the second drain side selection MOS transistor and the drain diffusion layer of the second source side selection MOS transistor;

a second block comprising:

a third drain side selection MOS transistor connected at a gate thereof to the third drain side selection gate line and connected at a drain diffusion layer thereof to the first bit line, a third source side selection MOS transistor connected at a gate thereof to the second source side selection gate line, a plurality of third memory cell transistors connected in series between the source diffusion layer of the third drain side selection MOS transistor and the drain diffusion layer of the third source side selection MOS transistor, a fourth drain side selection MOS transistor connected at a gate thereof to the fourth drain side selection gate line and connected at a drain diffusion layer thereof to the second bit line, a fourth source side selection MOS transistor connected at a gate thereof to the second source side selection gate line, and a plurality of fourth memory cell transistors connected in series between the source diffusion layer of the fourth drain side selection MOS transistor and the drain diffusion layer of the fourth source side selection MOS transistor; and a decoder which turns on one of the first and third drain side selection MOS transistors and turns off the other, and which turns on one of the third and fourth drain side selection MOS transistors and turns off the other.

2. The NAND flash memory according to claim 1, wherein when conducting write operations or read operations on the first and second blocks in parallel, the decoder turns on one of the first and third drain side selection MOS transistors and turns off the other, and turns on one of the second and fourth drain side selection MOS transistors and turns off the other.

3. The NAND flash memory according to claim 1, wherein the decoder turns on the first and fourth drain side selection MOS transistors and turns off the second and third drain side selection MOS transistors.

4. The NAND flash memory according to claim 2, wherein the decoder turns on the first and fourth drain side selection MOS transistors and turns off the second and third drain side selection MOS transistors.

5. The NAND flash memory according to claim 1, wherein the decoder comprises:

a first decoder controlling an operation of the first block based on a control signal of a first system; and a second decoder controlling an operation of the second block based on a control signal of a second system.

6. The NAND flash memory according to claim 5, wherein the first and second decoder conduct erase operations on the first block and the second block in parallel.

7. The NAND flash memory according to claim 5, wherein the first decoder controls potentials on the first drain side selection gate line and the second drain side selection gate line, the second decoder controls potentials on the third drain side selection gate line and the fourth drain side selection gate line, consequently one of the first and third drain side selection MOS transistors is turned on whereas the other is turned off, and one of the second and fourth drain side selection MOS transistors is turned on whereas the other is turned off.

8. The NAND flash memory according to claim 1, wherein a part of the first drain side selection gate line is located over the drain diffusion layer of the second drain side selection MOS transistor via an insulation film, a part of the second drain side selection gate line is located over the drain diffusion layer of the first drain side selection MOS transistor via an insulation film, a part of the third drain side selection gate line is located over the drain diffusion layer of the fourth drain side selection MOS transistor via an insulation film, and a part of the fourth drain side selection gate line is located over the drain diffusion layer of the third drain side selection MOS transistor via an insulation film.

9. The NAND flash memory according to claim 2, wherein a part of the first drain side selection gate line is located over the drain diffusion layer of the second drain side selection MOS transistor via an insulation film, a part of the second drain side selection gate line is located over the drain diffusion layer of the first drain side selection MOS transistor via an insulation film, a part of the third drain side selection gate line is located over the drain diffusion layer of the fourth drain side selection MOS transistor via an insulation film, and a part of the fourth drain side selection gate line is located over the drain diffusion layer of the third drain side selection MOS transistor via an insulation film.

10. The NAND flash memory according to claim 1, wherein the first block and second block are formed in a same well.

11. The NAND flash memory according to claim 2, wherein the first block and second block are formed in a same well.

12. The NAND flash memory according to claim 1, wherein the decoder comprises:

a first control line;

a second control line;

a third control line;

a fourth control line;

a first transfer MOS transistor connected at a first end thereof to the first control line and connected at a second end thereof to the first drain side selection gate line;

a second transfer MOS transistor connected at a first end thereof to the second control line and connected at a second end thereof to the first drain side selection gate line;

a third transfer MOS transistor connected at a first end thereof to the third control line and connected at a second end thereof to the second drain side selection gate line; and a fourth transfer MOS transistor connected at a first end thereof to the fourth control line and connected at a second end thereof to the second drain side selection gate line.

13. The NAND flash memory according to claim 2, wherein the decoder comprises:
a first control line;
a second control line;
a third control line;
a fourth control line;
a first transfer MOS transistor connected at a first end thereof to the first control line and connected at a second end thereof to the first drain side selection gate line;
a second transfer MOS transistor connected at a first end thereof to the second control line and connected at a second end thereof to the first drain side selection gate line;
a third transfer MOS transistor connected at a first end thereof to the third control line and connected at a second end thereof to the second drain side selection gate line; and
a fourth transfer MOS transistor connected at a first end thereof to the fourth control line and connected at a second end thereof to the second drain side selection gate line.

14. The NAND flash memory according to claim 3, wherein the decoder comprises:
a first control line;
a second control line;
a third control line;
a fourth control line;
a first transfer MOS transistor connected at a first end thereof to the first control line and connected at a second end thereof to the first drain side selection gate line;
a second transfer MOS transistor connected at a first end thereof to the second control line and connected at a second end thereof to the first drain side selection gate line;
a third transfer MOS transistor connected at a first end thereof to the third control line and connected at a second end thereof to the second drain side selection gate line; and
a fourth transfer MOS transistor connected at a first end thereof to the fourth control line and connected at a second end thereof to the second drain side selection gate line.

15. The NAND flash memory according to claim 4, wherein the decoder comprises:
a first control line;
a second control line;
a third control line;
a fourth control line;
a first transfer MOS transistor connected at a first end thereof to the first control line and connected at a second end thereof to the first drain side selection gate line;
a second transfer MOS transistor connected at a first end thereof to the second control line and connected at a second end thereof to the first drain side selection gate line;
a third transfer MOS transistor connected at a first end thereof to the third control line and connected at a second end thereof to the second drain side selection gate line; and
a fourth transfer MOS transistor connected at a first end thereof to the fourth control line and connected at a second end thereof to the second drain side selection gate line.

16. The NAND flash memory according to claim 1, wherein the decoder comprises:
a first control line;
a second control line;
a first transfer MOS transistor connected at a first end thereof to the first control line and connected at a second end thereof to a word line which is connected to a control gate of the first memory cell transistor; and
a second transfer MOS transistor connected at a first end thereof to the second control line and connected at a second end thereof to the word line, and
the decoder controls a potential on the word line by turning on one of the first and second transfer MOS transistors and turning off the other and controlling potentials on the first and second control lines.

17. The NAND flash memory according to claim 2, wherein the decoder comprises:
a first control line;
a second control line;
a first transfer MOS transistor connected at a first end thereof to the first control line and connected at a second end thereof to a word line which is connected to a control gate of the first memory cell transistor; and
a second transfer MOS transistor connected at a first end thereof to the second control line and connected at a second end thereof to the word line, and
the decoder controls a potential on the word line by turning on one of the first and second transfer MOS transistors and turning off the other and controlling potentials on the first and second control lines.

18. The NAND flash memory according to claim 3, wherein the decoder comprises:
a first control line;
a second control line;
a first transfer MOS transistor connected at a first end thereof to the first control line and connected at a second end thereof to a word line which is connected to a control gate of the first memory cell transistor; and
a second transfer MOS transistor connected at a first end thereof to the second control line and connected at a second end thereof to the word line, and
the decoder controls a potential on the word line by turning on one of the first and second transfer MOS transistors and turning off the other and controlling potentials on the first and second control lines.

19. The NAND flash memory according to claim 4, wherein the decoder comprises:
a first control line;
a second control line;
a first transfer MOS transistor connected at a first end thereof to the first control line and connected at a second end thereof to a word line which is connected to a control gate of the first memory cell transistor; and
a second transfer MOS transistor connected at a first end thereof to the second control line and connected at a second end thereof to the word line, and the decoder controls a potential on the word line by turning on one of the first and second transfer MOS transistors and turning off the other and controlling potentials on the first and second control lines.

20. The NAND flash memory according to claim 5, wherein the decoder comprises:

a first control line;

a second control line;

a first transfer MOS transistor connected at a first end thereof to the first control line and connected at a second end thereof to a word line which is connected to a control gate of the first memory cell transistor; and a second transfer MOS transistor connected at a first end thereof to the second control line and connected at a second end thereof to the word line, and the decoder controls a potential on the word line by turning on one of the first and second transfer MOS transistors and turning off the other and controlling potentials on the first and second control lines.

* * * * *